United States Patent
Orita et al.

(10) Patent No.: US 8,443,333 B2
(45) Date of Patent: May 14, 2013

(54) COMPUTER PRODUCT, APPARATUS, AND METHOD FOR SUPPORTING DESIGN

(75) Inventors: Takahiko Orita, Kawasaki (JP);
Kazunori Kumagai, Kawasaki (JP);
Yoshitaka Nishio, Kawasaki (JP); Ikuo Ohtsuka, Kawasaki (JP); Motoyuki Tanisho, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/044,166

(22) Filed: Mar. 9, 2011

(65) Prior Publication Data
US 2011/0225561 A1    Sep. 15, 2011

(30) Foreign Application Priority Data
Mar. 12, 2010   (JP) .................. 2010-056351

(51) Int. Cl.
*G06F 15/04* (2006.01)
*G06F 17/50* (2006.01)

(52) U.S. Cl.
USPC ........................................... 716/139

(58) Field of Classification Search .................. 716/139
See application file for complete search history.

(56) References Cited

U.S. PATENT DOCUMENTS

| | | | |
|---|---|---|---|
| 6,457,165 B1 * | 9/2002 | Ishikawa et al. | 716/126 |
| 6,584,608 B1 | 6/2003 | Kumada et al. | |
| 6,640,332 B2 * | 10/2003 | Mitome et al. | 716/126 |
| 2003/0023947 A1 * | 1/2003 | Sakakura et al. | 716/17 |
| 2011/0010683 A1 * | 1/2011 | Potts et al. | 716/126 |
| 2011/0093829 A1 * | 4/2011 | Orita et al. | 716/129 |

FOREIGN PATENT DOCUMENTS

JP   11-110434 A   4/1999

* cited by examiner

*Primary Examiner* — Suresh Memula
(74) *Attorney, Agent, or Firm* — Fujitsu Patent Center

(57) ABSTRACT

A non-transitory computer-readable recording medium storing a design supporting program causes a computer to perform: acquiring non-complying line lengths of a plurality of wiring paths; drawing for each of the wiring paths a wiring pattern connecting a transmission origin and a transmission destination based on a line length and a wiring route of the wiring path; and controlling the drawing to draw a line for each of the wiring paths, the line being divided into a first line amounting to a non-complying line length acquired at the acquiring and a second line being a wiring pass less the non-complying line length.

14 Claims, 39 Drawing Sheets

FIG.18

VIA TABLE

1800

| VIA NUMBER | NET NUMBER | COORDINATES | LAYER NUMBER | LAND SHAPE NUMBER |
|---|---|---|---|---|
| 1 | 1 | (10000, 21000) | 1-16 | 2 |
| 2 | 1 | (10500, 21000) | 1-16 | 2 |
| ... | ... | ... | ... | ... |
| Nvia | Nnet | ... | 1-16 | 2 |

FIG.19

LINE TABLE

1900

| VIA NUMBER | NET NUMBER | From-To COORDINATES | LINE WIDTH | LAYER NUMBER |
|---|---|---|---|---|
| 1 | 1 | (10000, 21000)-(15000, 21000) | 100 | 3 |
| 2 | 1 | (15000, 21000)-(16000, 22000) | 100 | 3 |
| ... | ... | ... | ... | ... |
| Nlin | Nnet | ... | 100 | 3 |

FIG.20

LINE LENGTH CONSTRAINING CONDITION TABLE (2000)

| CONSTRAIN-ING CONDITION NUMBER | LINE LENGTH CONDITION INFORMATION | LINE LENGTH BASE INFORMATION | WIRING PATH NUMBER LIST | DISPLAY CONTROL NUMBER |
|---|---|---|---|---|
| 1 | BASE−1000 ~ BASE+1000 | WIRING PATH NUMBER 2 | 1, 2, 3, 4, 5, 6, 7, 8 | 1 |
| 2 | BASE−500 ~ BASE+500 | AVERAGE LINE LENGTH OF WIRING PATHS | 9, 10, 11, 12 | 2 |
| ... | ... | ... | ... | ... |
| Ncod | BASE−500 ~ BASE+500 | AVERAGE LINE LENGTH OF WIRING PATHS | | |

FIG.21

WIRING PATH TABLE 2100

| WIRING PATH NUMBER | WIRING CONNECTION ORDER ELEMENT LIST | LINE LENGTH | LINE LENGTH JUDGMENT INFORMATION |
|---|---|---|---|
| 1 | COMPONENT PIN 1, VIA 1, VIA 8, COMPONENT PIN 8 | 28500 | -500 |
| 2 | COMPONENT PIN 2, VIA 2, VIA 9, COMPONENT PIN 9 | 30000 | OK |
| ⋮ | ⋮ | ⋮ | ⋮ |
| Npth | | | |

FIG.22

DISPLAY PATH TABLE 2200

| LINE LENGTH NUMBER | LOGICAL LINE LENGTH | TENTATIVE LINE LENGTH | TENTATIVE LINE LENGTH INFORMATION | DISPLAY SECTION NUMBER LIST | IDENTICAL PATH LIST | PARENT PATH NUMBER |
|---|---|---|---|---|---|---|
| 1 | UNDEFINED | UNDEFINED | -500 | 1 | 1 | UNDEFINED |
| 2 | UNDEFINED | UNDEFINED | OK | 2 | 2, 9 | UNDEFINED |
| ⋮ | ⋮ | ⋮ | ⋮ | ⋮ | ⋮ | ⋮ |
| Npth | | | | | | |

FIG.23

DISPLAY SECTION TABLE — 2300

| DISPLAY SECTION NUMBER | RENDERING COLOR | LINE WIDTH | LINE TYPE | PATTERN TYPE | DISPLAY SECTION |
|---|---|---|---|---|---|
| 1 | RED | UNDEFINED | UNDEFINED | UNDEFINED | (10000, 21000), ..., (10500, 220000) |
| 2 | BROWN | UNDEFINED | UNDEFINED | UNDEFINED | (10500, 21000), ..., (20500, 310000) |
| ... | ... | ... | ... | ... | ... |
| Ndsp | | | | | |

FIG.25

DISPLAY METHOD TABLE 2500

| DISPLAY METHOD NUMBER | DISPLAY METHOD |
|---|---|
| 1. | LINE LENGTH ERROR IS DISPLAYED BY CHANGING COLOR OVER LENGTH OF NON-COMPLIANT LINE LENGTH. -: RED, +: BLUE |
| 2. | LINE LENGTH ERROR IS DISPLAYED BY CHANGING LINE WIDTH OVER LENGTH OF NON-COMPLIANT LINE LENGTH. -: THIN, +: THICK |
| 3. | LINE LENGTH ERROR IS DISPLAYED BY CHANGING LINE TYPE OVER LENGTH OF NON-COMPLIANT LINE LENGTH. -: DOTTED, +: HATCHED |
| 4. | LINE LENGTH ERROR IS DISPLAYED BY CHANGING PATTERN TYPE OVER LENGTH OF NON-COMPLIANT LINE LENGTH. -: PATTERN 1, +: PATTERN 2 |
| 5. | ERROR DISPLAY IS EXECUTED FOR ENTIRE WIRING PATH BY USING COLOR THAT CORRESPONDS TO NON-COMPLIANT LINE LENGTH. -: COOL COLOR, +: WARM COLOR |
| 6. | BASE WIRING PATH IS DISPLAYED IN DIFFERENT COLOR |
| 7. | SECTION WHOSE LINE LENGTH IS TO BE ADJUSTED IS ACQUIRED FROM CIRCUIT TOPOLOGY AND ERROR DISPLAY IS EXECUTED IN THIS SECTION |
| 8. | ERROR DISPLAY IS EXECUTED IN WIRING SECTION IN SCREEN DISPLAY RANGE |
| 9. | ERROR DISPLAY IS EXECUTED IN SECTION IN ERROR DISPLAY AREA DESIGNATED |
| 10. | FOR WIRING PATH HAVING MULTIPLE CONDITIONS, WIRING PATTERN IS DIVIDED AND EACH RESULTING WIRING PATTERN IS DISPLAYED |
| 11. | FOR WIRING PATH HAVING MULTIPLE CONDITIONS HAVING RELATION SUCH THAT ONE (A) INFLUENCES ANOTHER CONDITION (B), ERROR DISPLAY IS EXECUTED BASED ON VALUE ACQUIRED BY RE-CALCULATING LINE LENGTH OF B |
| 12. | FOR WIRING PATH THAT IS NOT COMPLETELY CONNECTED, LOGICAL LINE LENGTH IS ACQUIRED AND ERROR DISPLAY IS EXECUTED BASED ON ACQUIRED VALUE |
| 13. | COMBINATION OF ANY TWO OR MORE DISPLAYING METHODS OF 1 TO 12 |

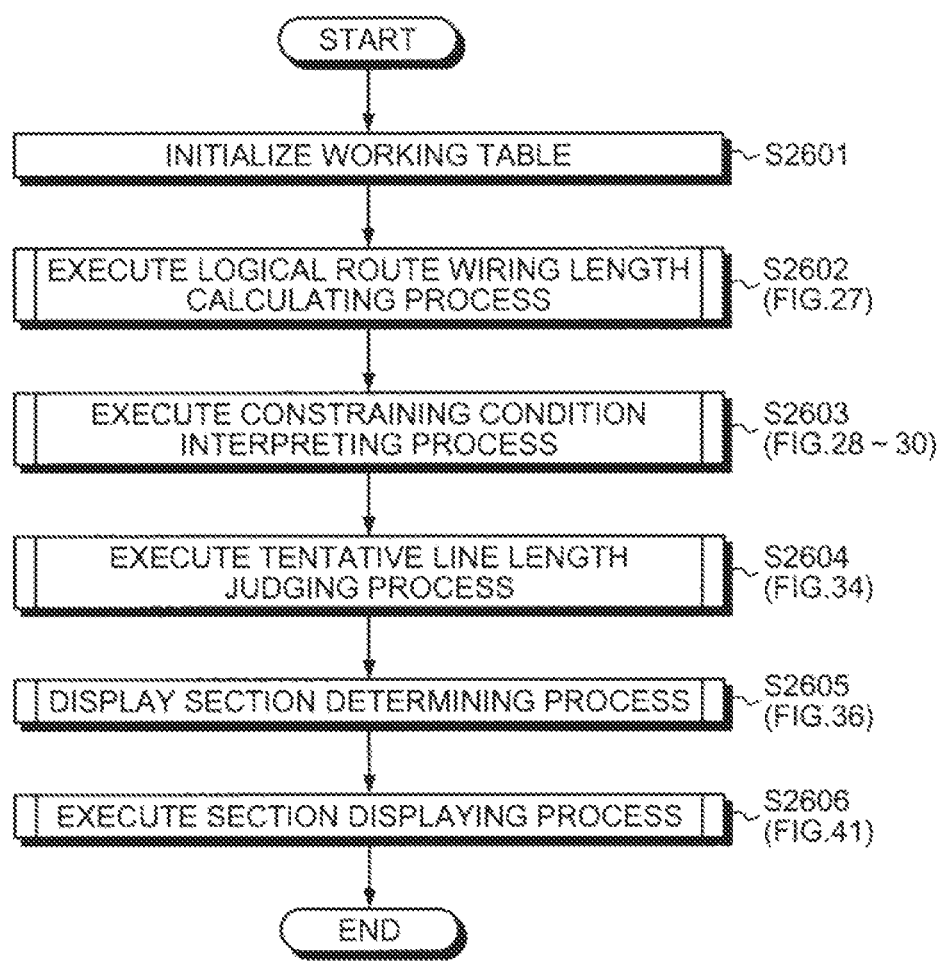

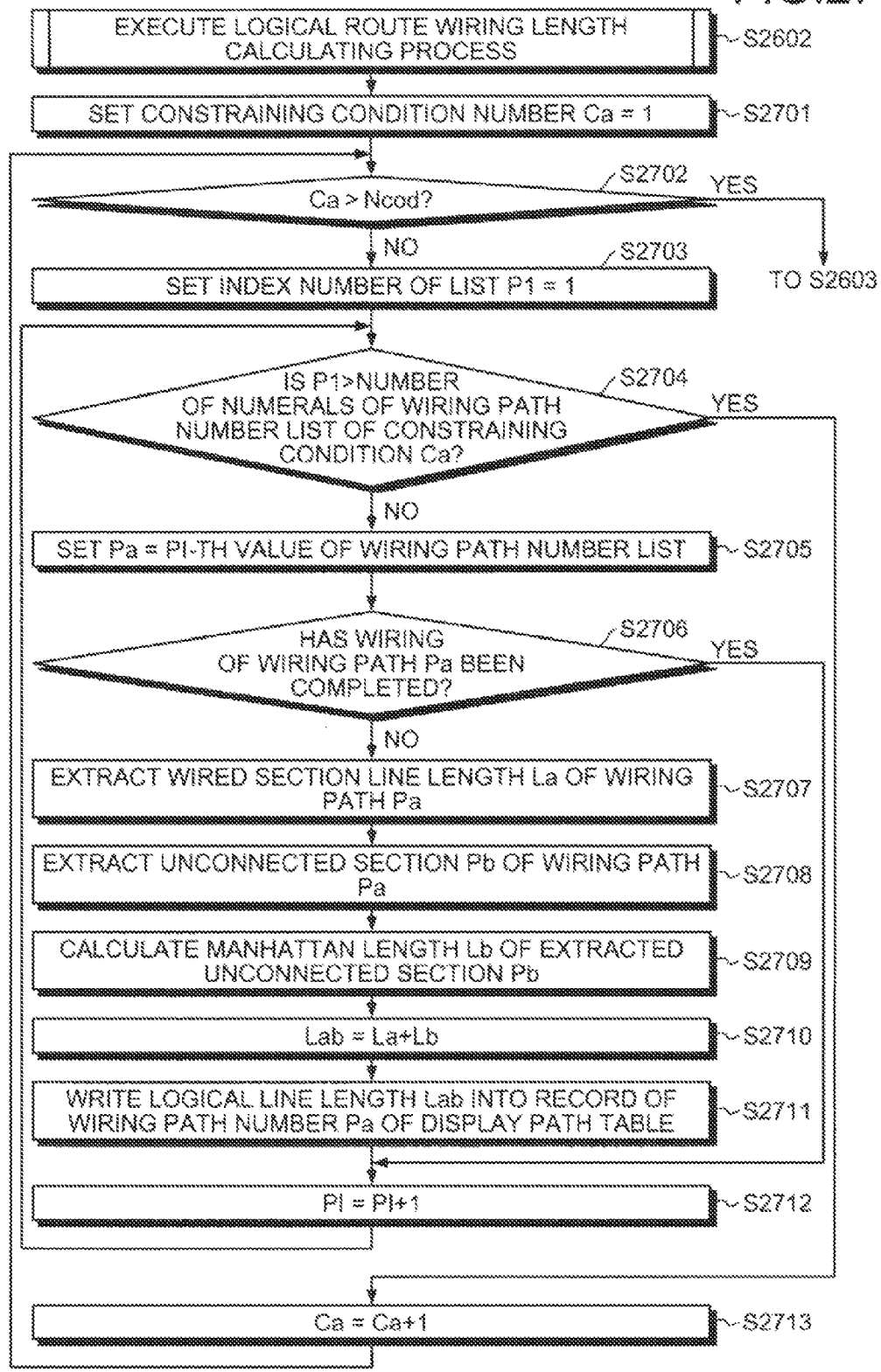

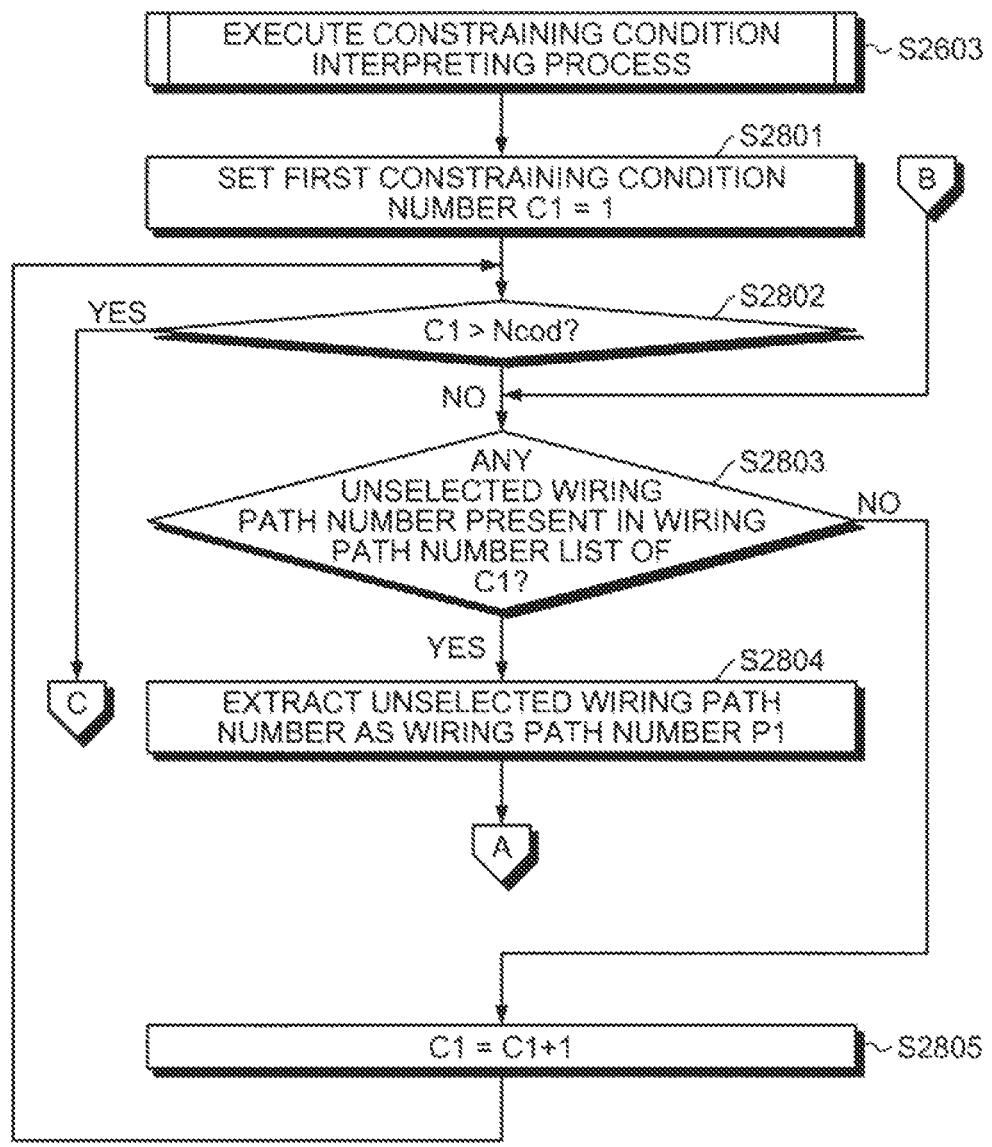

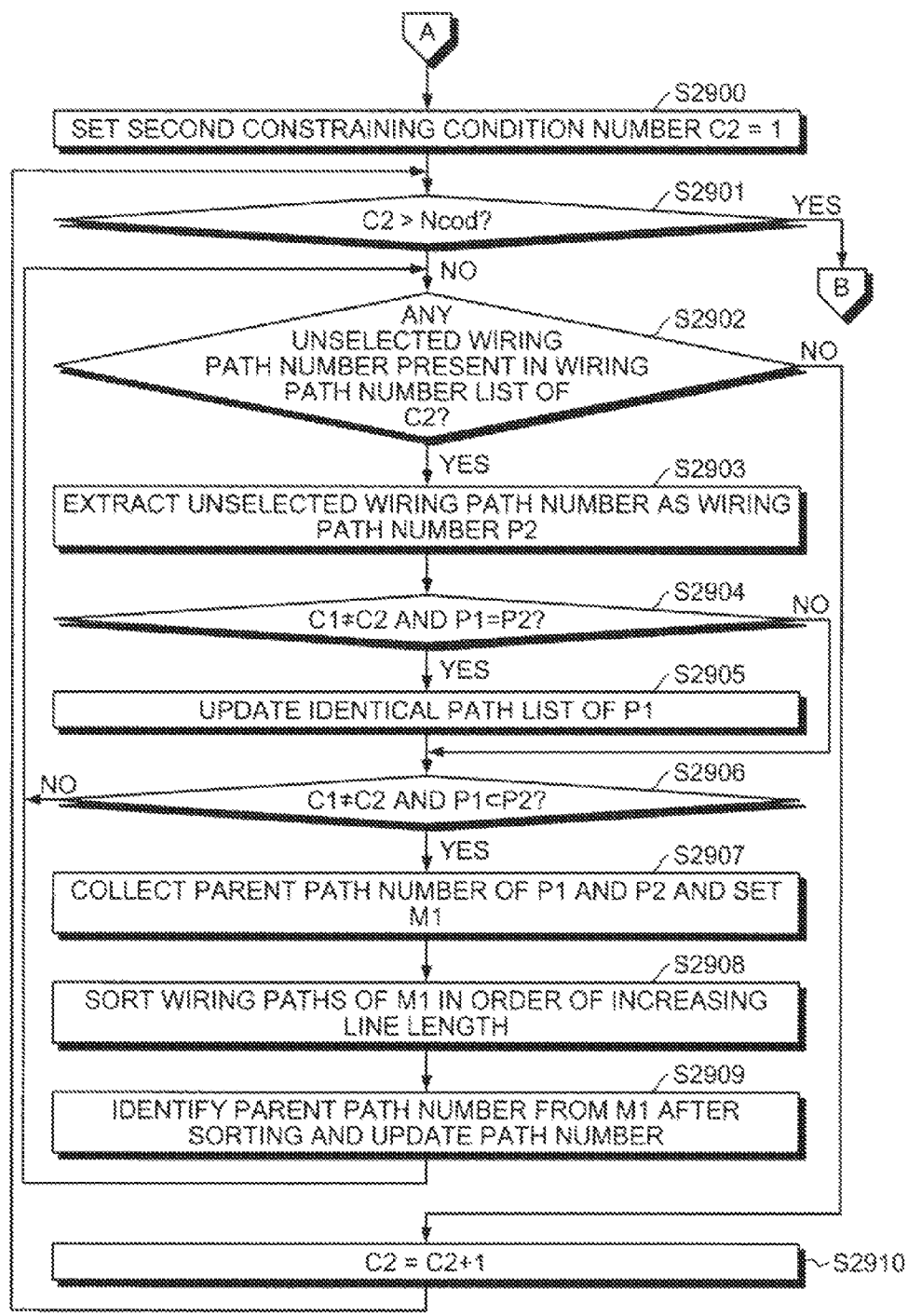

FIG.33D

| LINE LENGTH NUMBER | TENTATIVE LINE LENGTH | PARENT PATH NUMBER |
|---|---|---|
| 1 | UNDEFINED | 2 |
| 2 | 14000 | 3 |
| 3 | UNDEFINED | UNDEFINED |

FIG.33E

| LINE LENGTH NUMBER | TENTATIVE LINE LENGTH | PARENT PATH NUMBER |
|---|---|---|
| 1 | UNDEFINED | 2 |
| 2 | 14000 | 3 |
| 3 | 19000 | UNDEFINED |

FIG.35

DISPLAY PATH TABLE ~2200

| LINE LENGTH NUMBER | TENTATIVE LINE LENGTH | TENTATIVE LINE LENGTH JUDGMENT | PARENT PATH NUMBER |
|---|---|---|---|
| 1 | UNDEFINED | -1000 | 2 |
| 2 | 14000 | -1000 | 3 |
| 3 | 19000 | -1000 | UNDEFINED |

COMPUTER PRODUCT, APPARATUS, AND METHOD FOR SUPPORTING DESIGN

CROSS REFERENCE TO RELATED APPLICATIONS

This application is based upon and claims the benefit of priority of the prior Japanese Patent Application No. 2010-056351, filed on Mar. 12, 2010, the entire contents of which are incorporated herein by reference.

FIELD

The embodiments discussed herein are related to supporting of a wiring design.

BACKGROUND

In designing the wiring of a printed circuit board, it has recently become common to provide design constraining conditions due to the decrease of the voltage of LSIs, the increase of the speed of the signal speed, etc. To match the timings of signals with each other that run in a wiring pattern interconnecting parts, there is a design constraining condition to instruct the line length for each wiring path such that each line length is acquired by a conversion based on a delay (propagation delay) of a signal running through the wiring path.

As to a group such as a bus including a plurality of wiring paths, a design constraining condition instructs equal delays such that input timings for receivers of the wiring paths coincide. A designing engineer executes the wiring work such that the design constraining condition is satisfied. However, a long time is needed for the work of wiring the wiring paths adjusting the line lengths thereof to comply with the constraints concerning the delays of the signals in the wiring paths without violating the design rules. Therefore, a wiring designing tool is disclosed that complies with the line length constraining condition (see, e.g., Japanese Laid-Open Patent Publication No. H11-110434).

However, in the conventional wiring designing tool, a display that presents non-complying line length of the wiring length is displayed in a window that is different from a screen that displays the wiring pattern. Therefore, a problem arises that it is difficult to cope with the correspondence of a wiring pattern to a non-complying line length. Another problem also arises that it is difficult to imagine an actual wiring pattern length that corresponds to a non-complying line length.

SUMMARY

According to an aspect of an embodiment, a non-transitory computer-readable recording medium storing a design supporting program causes a computer to perform: acquiring non-complying line lengths of a plurality of wiring paths; drawing for each of the wiring paths a wiring pattern connecting a transmission origin and a transmission destination based on a line length and a wiring route of the wiring path; and controlling the drawing to draw a line for each of the wiring paths, the line being divided into a first line amounting to a non-complying line length acquired at the acquiring and a second line being a wiring pass less the non-complying line length.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 18 is an exemplary diagram depicting a via table 1800.

FIG. 19 is an exemplary diagram depicting a line table 1900.

FIG. 20 is an exemplary diagram depicting a line length constraining condition table 2000.

FIG. 21 is an exemplary diagram depicting a wiring path table 2100.

FIG. 22 is an exemplary diagram depicting a display path table 2200.

FIG. 23 is an exemplary diagram depicting a display section table 2300.

FIG. 25 is an exemplary diagram depicting a display method table 2500.

FIG. 26 is a flowchart of a design support process according to embodiments.

FIG. 27 is a flowchart of the detail of a logical route wiring length calculating process (step S2602) depicted in FIG. 26.

FIG. 28 is a flowchart depicting details of a constraining condition interpreting process (step S2603) depicted in FIG. 26.

FIG. 29 is a flowchart depicting details of a constraining condition interpreting process (step S2603) depicted in FIG. 26.

FIG. 33D is an explanatory diagram of exemplary updating of the display path table 2200.

FIG. 33E is an explanatory diagram of exemplary updating of the display path table 2200.

FIG. 35 is an explanatory diagram of the display path table 2200 into which tentative line length judgment information is written.

DESCRIPTION OF EMBODIMENTS

Preferred embodiments of the present invention will be explained with reference to the accompanying drawings. In the embodiment, a wiring path that does not comply with a line length constraining condition is automatically detected in design data and the non-complying line length of the line lengths is displayed overlapping the wiring pattern of the wiring path. Thereby, presence or absence of any non-complying wiring path and the length of a non-complying line length can be presented collectively to the designing engineer. Therefore, improvement of the efficiency is facilitated of the editing work of editing the wiring pattern by the designing engineer to satisfy the constraining conditions.

The "wiring path" used herein refers to information that indicates the connection relation of the objects to be wired with each other, using component pins and vias to designate relaying points for wiring, etc. The "wiring pattern" used herein refers to layout data that indicates conductors (lines) to electrically connect parts to each other according to the wiring paths. A line length under the constraining condition is acquired by extracting physically connected wiring patterns comparing the wiring patterns with the connection relations of the wiring paths, and converting all the extracted wiring patterns into the line lengths of the wiring paths according to a converting method that is instructed in the line length constraining condition. The "non-complying line length" refers to a line length by which a path is shorter than (apart from) the range of a standard value in the line length constraining condition or a line length by which a path is longer than (apart from) the range. To adjust the timings of signals that run among the parts: each delay of each signal is converted into numerical values; the numerical values are defined in the constraining condition as constraints on the line lengths; and the line lengths are adjusted and, thereby, delays are adjusted. However, even when the delays are defined in the constraining condition as the constraints on the delays without converting the delays into the line lengths, the delays can also be directly handled because only the units of the values used in the internal calculation are different.

In the embodiment, using 13 display examples, the presence or absence of any non-complying wiring path and the length of a non-complying line length are presented collectively to the designing engineer. The first to thirteenth display examples in the embodiment will sequentially be described.

Figure 1:
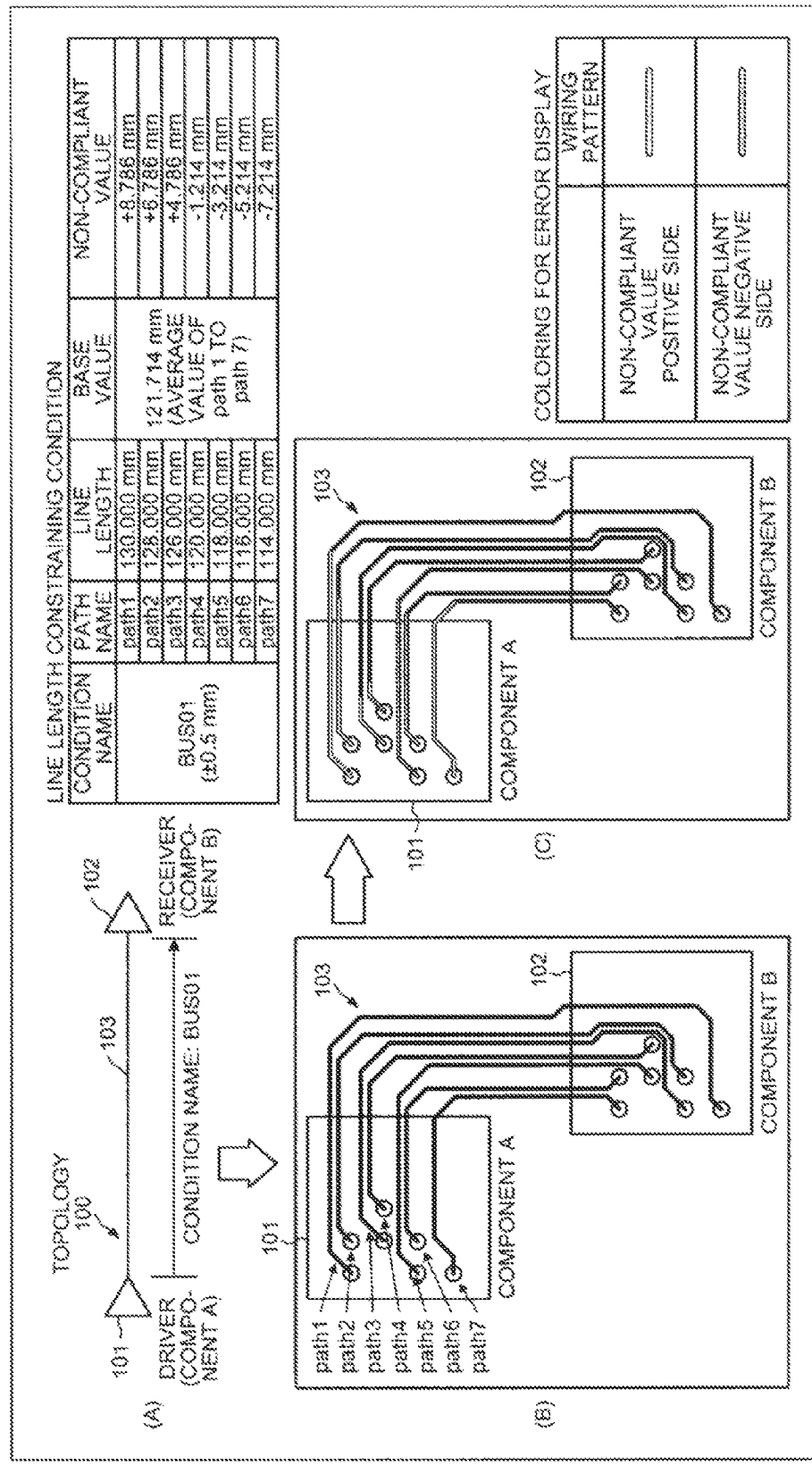
FIG. 1 is an explanatory diagram depicting a first display example.

FIG. 1 is an explanatory diagram of the first display example. The first display example is an exemplary display where a rendering color of the wiring pattern is changed for the non-complying line length of wiring paths. In the first display example, (A) a topology 100 made up of a bus 103 between a driver 101 and a receiver 102 is connected according to a line length constraining condition.

The line length constraining condition provides a condition name, a path name, a line length, a base value, and a non-complying value. The "condition name" is a name of the line length constraining condition. In this case, "BUS01" is the condition name. "±0.5 mm" is provided as the line length condition for BUS01 and this means that when the length of a wiring path is within ±0.5 mm from the base value (the average line length), the wiring path is isometric. "Isometric" means that each line length within the range of the line length condition satisfies the line length constraining condition.

In the line length constraining condition, the "path name" is the name of a wiring path that is provided in the line length constraining condition. In this case, the path name is each of the names of seven wiring paths (path1 to path7) that form the bus 103.

The "base value" is information that is the base of the wiring paths (in this case, path1 to path7) that are provided in the line length constraining condition. For example, a line length of a specific wiring path selected from the wiring paths that are provided in the line length constraining condition or the average line length of the wiring paths that are provided in the line length constraining condition is used as the base value. In this case, the average line length is employed as the base value.

The "non-complying value" refers to a line length by which a path is shorter than the range of a base value in the line length constraining condition or by which a path is longer than the range. More specifically, as to an arbitrary wiring path, when the line length thereof is longer than the base value, a positive value is a non-complying line length that is acquired by subtracting an upper limit line length for the isometric wiring from the line length of the wiring path. On the other hand, when the line length thereof is shorter than the base value, a negative value is a non-complying line length that is acquired by subtracting a lower limit line length for the isometric wiring from the line length of the wiring path. When a line length of a wiring path is isometric (length between the upper and the lower limit line lengths), the line length constraining condition is complied with.

For example, the line length of path1 is 130.000 [mm] and the base value is 121.714 [mm]. Therefore, subtracting 122.214 [mm] (=121.714 [mm]+0.5 [mm]), the upper limit line length, from the line length of path1 of 130.000 [mm] gives +8.786 [mm] (>0). Therefore, the line length of path1 is excessive by the length of 8.786 [mm].

The line length of path 4 is 120.000 [mm] and the base value is 121.714 [mm]. Therefore, subtracting 121.214 [mm] (=121.714 [mm]−0.5 [mm]), the lower limit line length, from the line length of path4 of 120.000 [mm] gives −1.214 [mm] (<0). Therefore, the line length of path 4 is short by the length of 1.214 [mm].

In the state of (B), a rendering color is applied to part of a wiring pattern corresponding to the line length of a non-complying value (hereinafter, "non-complying line length") for each of the wiring patterns of the wiring paths and, thereby, error displays are presented. Thereby, the state of (C) is acquired. When drawing is executed, different rendering colors are used depending on the sign of a non-complying value. A wiring pattern with no error display is a wiring path that complies with the line length constraining condition.

As above, in the first display example, which wiring path violates the line length constraint, what the magnitude of the violation is when any violation of the line length constraint is present, and whether the violation is an excessive length or an insufficient length can collectively be presented to the design engineer. Therefore, the designing engineer can intuitively grasp how much each of the wiring paths should be shortened or extended to achieve the isometric wiring. Therefore, the wiring patterns can efficiently be edited to comply with the line length constraining condition.

Figure 2:
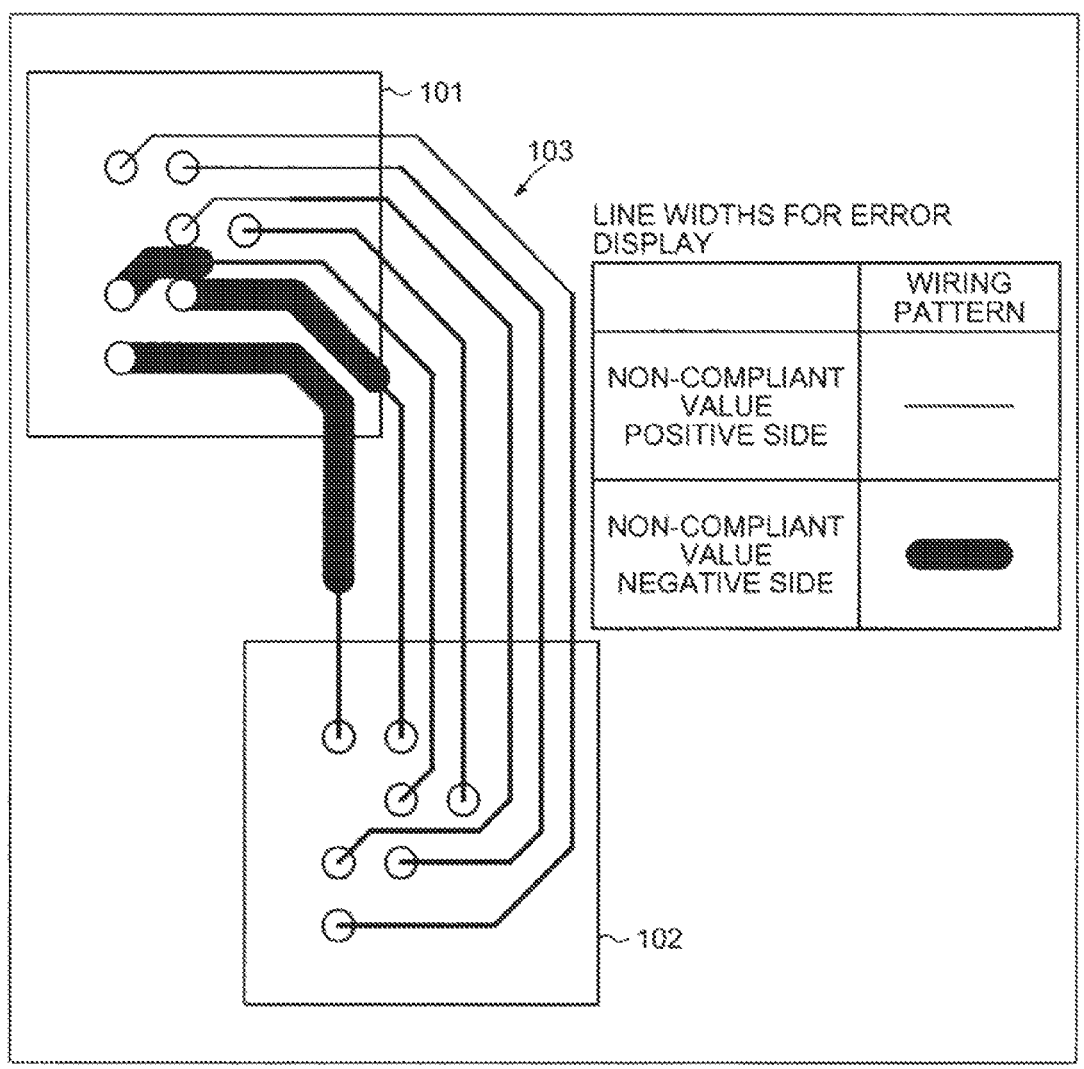
FIG. 2 is an explanatory diagram depicting a second display example.

FIG. 2 is an explanatory diagram of the second display example. The first display example uses different rendering colors depending on the sign of the non-complying value. However, the second display example uses different line widths for part of the wiring patterns corresponding to non-complying line lengths for each wiring pattern of the wiring paths in the state of (B) of FIG. 1.

In FIG. 2, the line width of each wiring pattern is thinned for the non-complying line length when a non-complying value is positive (an excess) and the line width of each wiring pattern is thickened for the non-complying line length when a non-complying value is negative (insufficiency), as an example. Though not depicted, a wiring pattern whose entire line width is constant is a wiring pattern that complies with the line length constraining condition.

As above, in the second display example, similarly as the first display example, which wiring path violates the line length constraint, what the magnitude of the violation is when any violation of the line length constraint is present, and whether the violation is an excessive length or an insufficient length can collectively be presented to the designing engineer. Therefore, the designing engineer can intuitively grasp how much each of the wiring paths should be shortened or extended to achieve the isometric wiring. Therefore, the wiring patterns can efficiently be edited to comply with the line length constraining condition.

Figure 3:
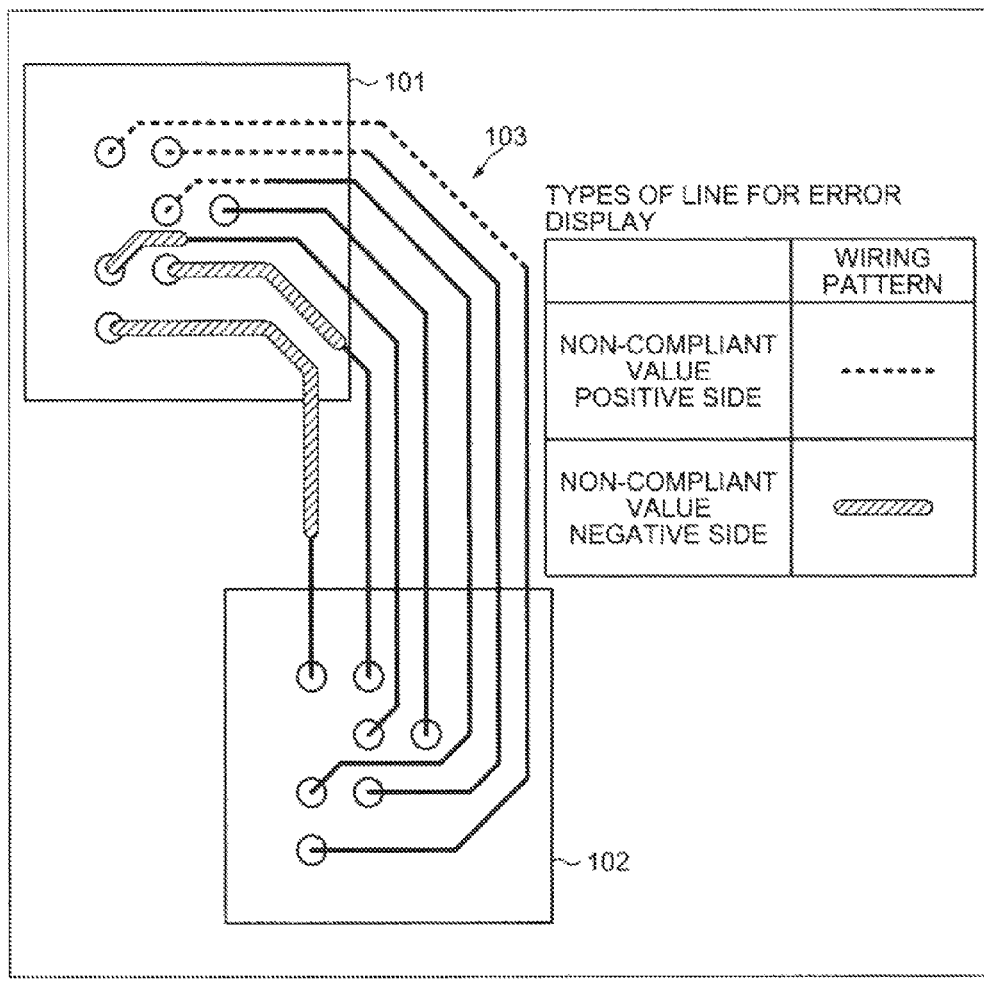
FIG. 3 is an explanatory diagram depicting a third display example.

FIG. 3 is an explanatory diagram of the third display example. The first display example uses different rendering colors depending on the sign of the non-complying value. However, the third display example uses different line types for part of the wiring patterns corresponding to non-complying line lengths for each wiring pattern of the wiring paths in the state of (B) of FIG. 1.

In FIG. 3, a line type of each wiring pattern is a dotted line for the non-complying line length when a non-complying value is positive (an excess) and a line type of each wiring pattern is a shaded line for the non-complying line length when a non-complying value is negative (insufficiency), as an example. Though not depicted, a wiring pattern whose entire line type is the same is a wiring pattern that complies with the line length constraining condition.

As above, in the third display example, similarly as the first display example, which wiring path violates the line length constraint, what the magnitude of the violation is when any violation of the line length constraint is present, and whether the violation is an excessive length or an insufficient length can collectively be presented to the designing engineer. Therefore, the designing engineer can intuitively grasp how much each of the wiring paths should be shortened or extended to achieve the isometric wiring. Therefore, the wiring patterns can efficiently be edited to comply with the line length constraining condition.

Figure 4:
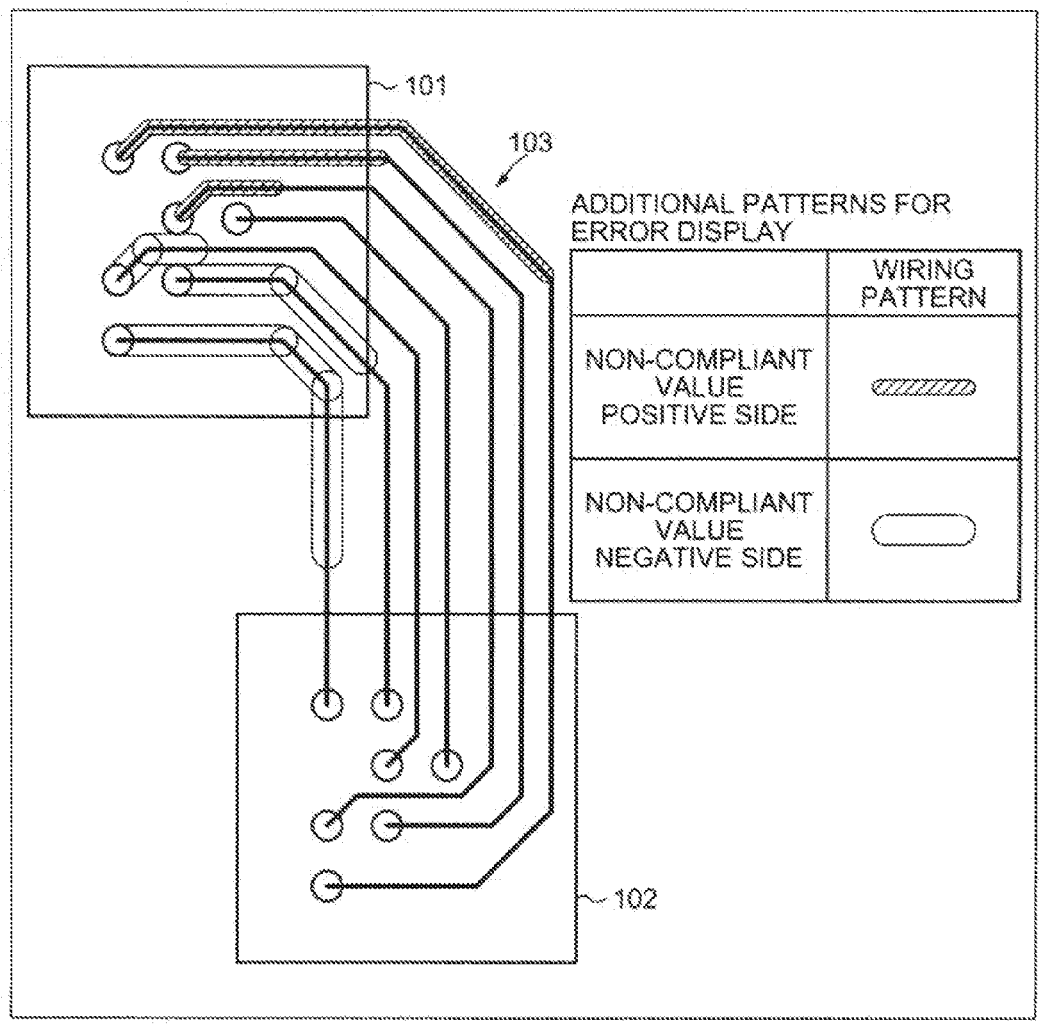
FIG. 4 is an explanatory diagram depicting a fourth display example.

FIG. 4 is an explanatory diagram of the fourth display example. The first display example uses different rendering colors depending on the sign of the non-complying value. However, the fourth display example uses different line graphics for part of the wiring patterns corresponding to non-complying line lengths for each wiring pattern of the wiring paths in the state of (B) of FIG. 1.

In FIG. 4, a line graphic of each wiring pattern is a narrow hatched line for the non-complying line length when a non-complying value is positive (an excess) and a line graphic of each wiring pattern is a wide line for the non-complying line length when a non-complying value is negative (insufficiency), as an example. Though not depicted, a wiring pattern whose entire line width is constant is a wiring pattern that complies with the line length constraining condition.

As above, in the fourth display example, similarly as the first display example, which wiring path violates the line length constraint, what the magnitude of the violation is when any violation of the line length constraint is present, and whether the violation is an excessive length or an insufficient length can collectively be presented to the designing engineer. Therefore, the designing engineer can intuitively grasp how much each of the wiring paths should be shortened or extended to achieve the isometric wiring. Therefore, the wiring patterns can efficiently be edited to comply with the line length constraining condition.

Figure 5:
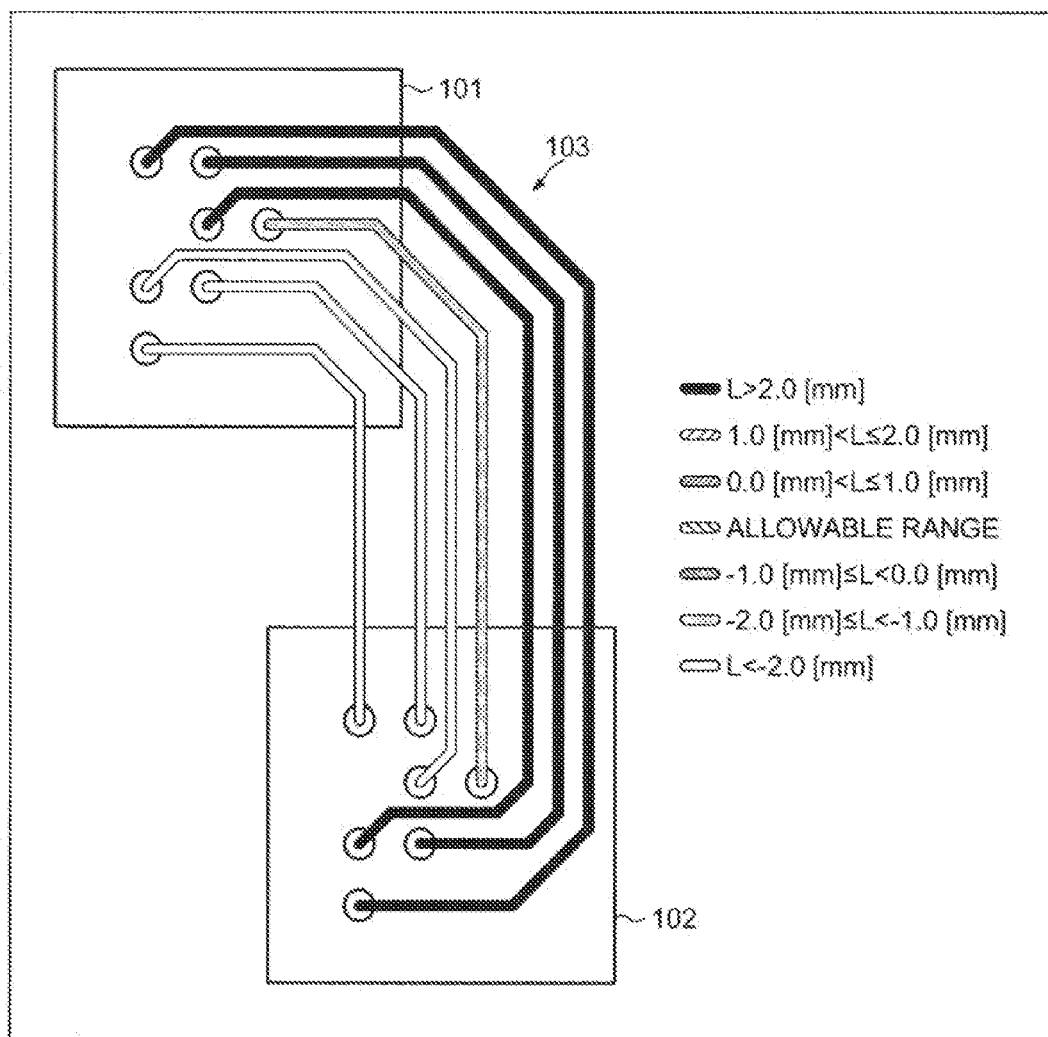
FIG. 5 is an explanatory diagram depicting a fifth display example.

FIG. 5 is an explanatory diagram of the fifth display example. The first display example uses different rendering colors depending on the sign of the non-complying value. However, the fifth display example uses different colors for non-complying line lengths for each wiring pattern of the wiring paths in the state of (B) of FIG. 1.

In FIG. 5, drawing is executed such that the color differs based on non-complying line lengths L that are L>2.0 [mm], $1.0<L\leq 2.0$ [mm], $0.0<L\leq 1.0$ [mm], an L that is in an allowable range (complying), $-1.0\leq L<0.0$ [mm], $-2.0\leq L<-1.0$ [mm], and L<−2.0 [mm], as an example. The rendering color corresponding to the allowable range indicates that a wiring path complies with the line length constraining condition.

As above, in the fifth display example, similarly as the first display example, which wiring path violates the line length constraint, what the magnitude of the violation is when any violation of the line length constraint is present, and whether the violation is an excessive length or an insufficient length can collectively be presented to the designing engineer.

Therefore, the designing engineer can intuitively grasp how much each of the wiring paths should be shortened or extended to achieve the isometric wiring. Therefore, the wiring patterns can efficiently be edited to comply with the line length constraining condition.

Figure 6:
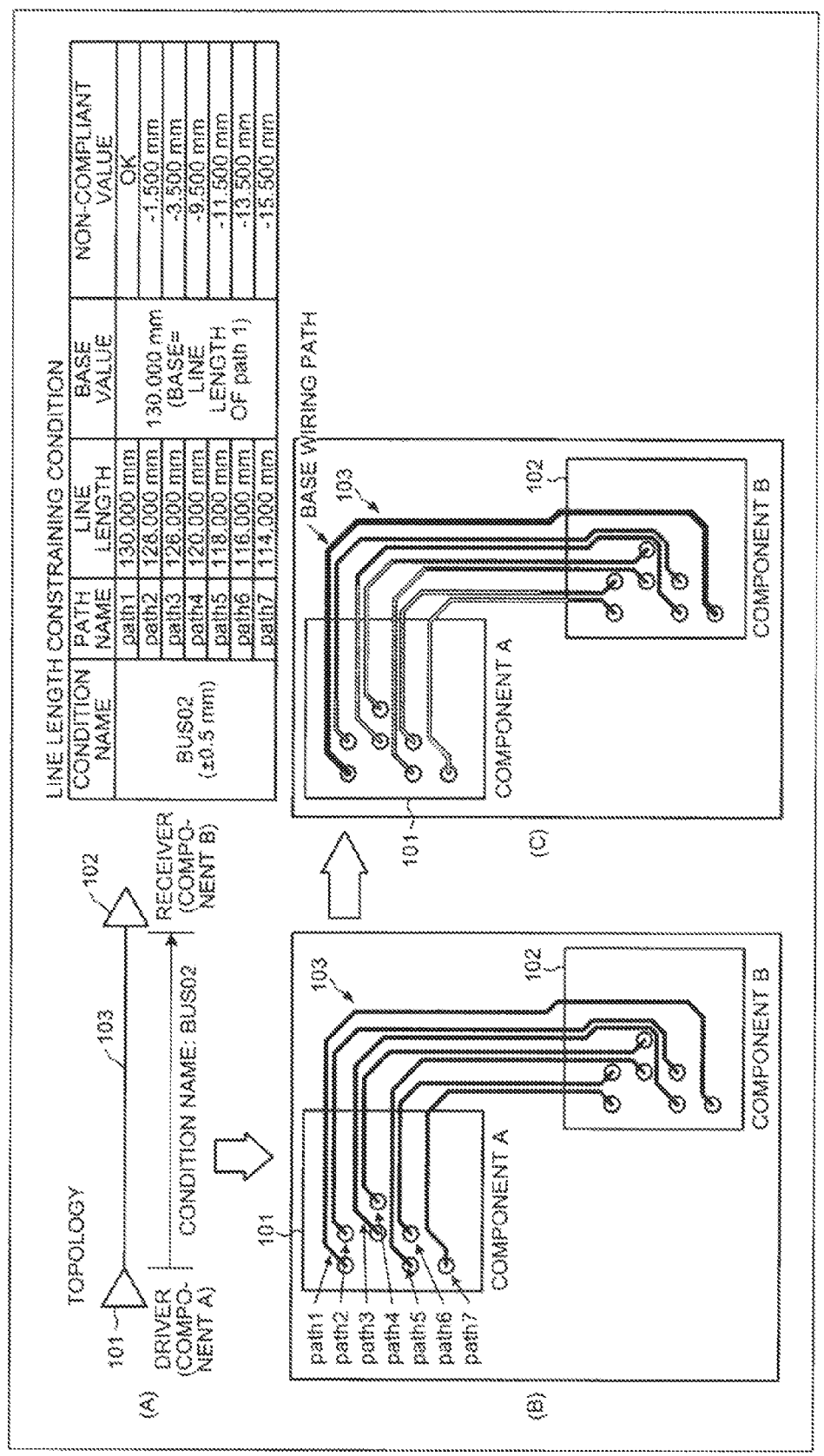
FIG. 6 is an explanatory diagram depicting a sixth display example.

FIG. 6 is an explanatory diagram of the sixth display example. In the first display example, when a specific wiring path is the base path in the line length constraining condition, the wiring patterns of the base path are drawn in a color that is different from that of the wiring patterns of other non-complying paths. In FIG. 6, the wiring pattern of path1 is the wiring patterns of the base path.

As above, in the sixth display example, similarly as the first display example, which wiring path violates the line length constraint, what the magnitude of the violation is when any violation of the line length constraint is present, and whether the violation is an excessive length or an insufficient length can collectively be presented to the designing engineer. Therefore, the designing engineer can intuitively grasp how much each of the base path or non-complying paths should be shortened or extended to achieve the isometric wiring. Therefore, the wiring patterns can efficiently be edited to comply with the line length constraining condition.

Figure 7:
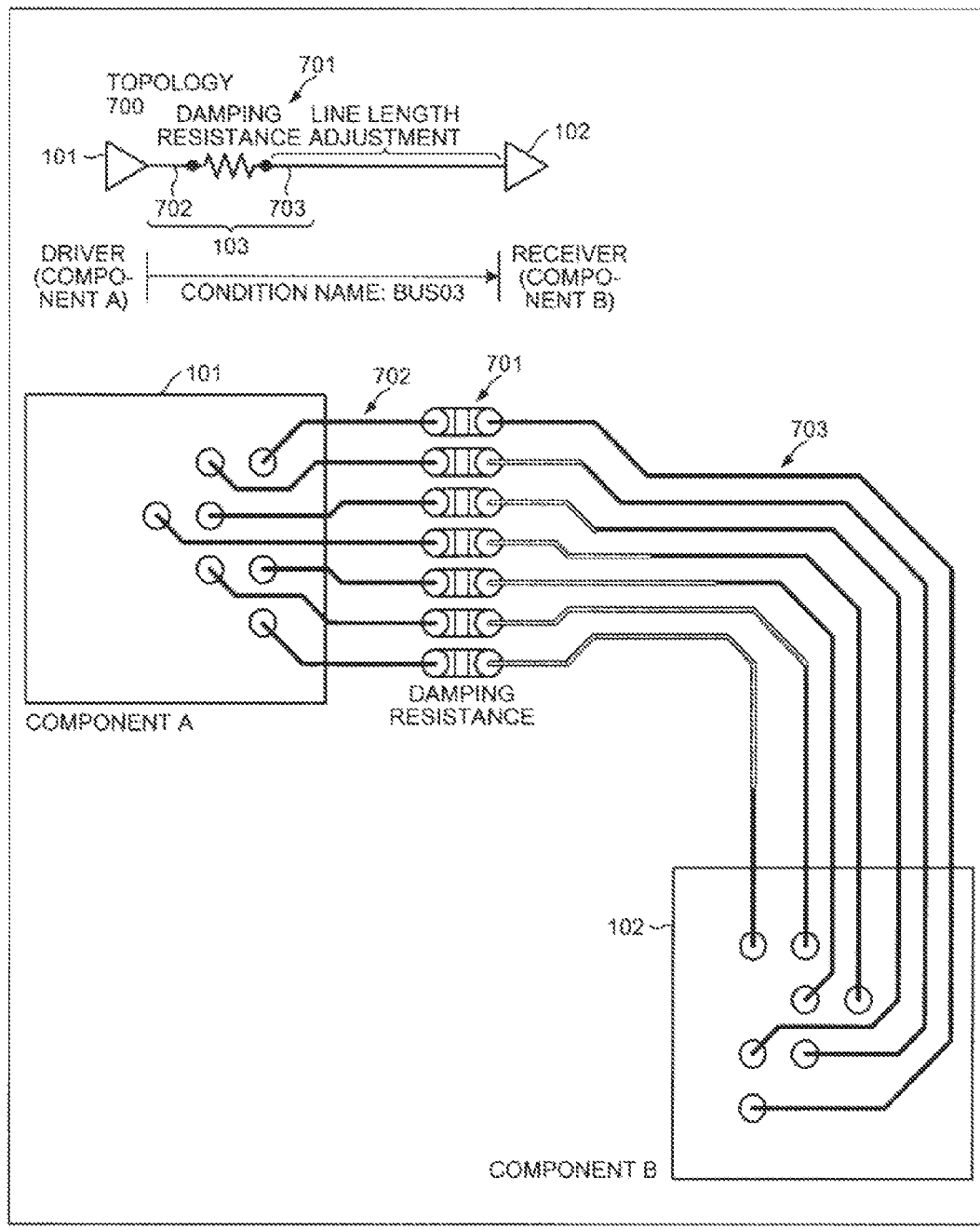
FIG. 7 is an explanatory diagram depicting a seventh display example.

FIG. 7 is an explanatory diagram of the seventh display example. The first display example is an example where no damping resistance is inserted between the driver 101 and the receiver 102 of the topology 100. The seventh display example is an example where a damping resistance 701 is inserted in the route 103 between the driver 101 and the receiver 102 of a topology 700. The damping resistance 701 is mounted near the driver 101. Therefore, when the line length is adjusted (extended), the adjustment is executed not using a route 702 between the driver 101 and the damping resistance 701 but using a route 703 between the damping resistance 701 and the receiver 102.

Therefore, in the seventh display example, when the damping resistance 701 is inserted: the route 703 whose line length is to be adjusted is extracted from the topology 700; and drawing of the non-complying line length is executed as depicted in the first display example for the wiring patterns that correspond to the route 703 extracted.

As above, in the seventh display example, similarly as the first display example, which wiring path violates the line length constraint, what the magnitude of the violation is when any violation of the line length constraint is present, and whether the violation is an excessive length or an insufficient length can collectively be presented to the designing engineer. Therefore, the designing engineer can intuitively grasp how much each of the paths should be shortened or extended to achieve the isometric wiring. Further, depicting a non-complying line length on a path to be adjusted enables a designer to focus on the pattern edition of line length without pondering which part to be adjusted. Therefore, the wiring patterns can efficiently be edited to comply with the line length constraining condition.

Figure 8:
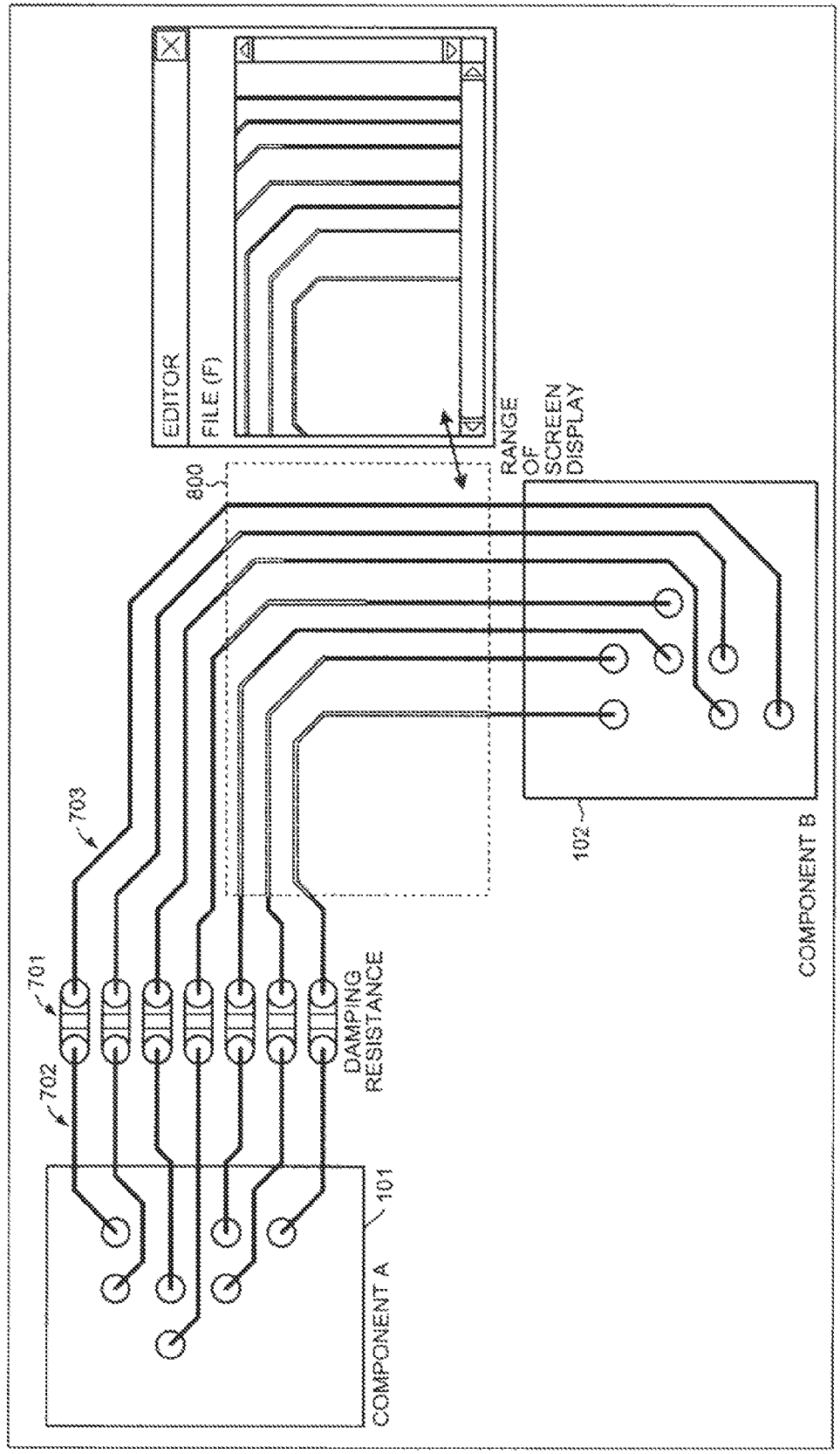
FIG. 8 is an explanatory diagram depicting an eighth display example.

FIG. 8 is an explanatory diagram of the eighth display example. The eighth display example illustrates an example of displaying a non-complying line length according to the zooming of a screen. For example, in the layout of FIG. 8, a rectangular area 800 is enlarged to display a non-complying line length. In other words, in the eighth display example, non-complying line lengths of a wiring pattern can be grasped irrespective of the size of a screen. As a result, no matter what size the screen may be, it can be presented together to a designing engineer which wiring path violates the line length constraint, what the magnitude of the violation is when any violation of the line length constraint is present, and whether the violation is an excessive length or an insufficient length. Therefore, the designing engineer can intuitively grasp how much each of the paths should be shortened or extended to achieve the isometric wiring. Therefore, the wiring patterns can efficiently be edited to comply with the line length constraining condition.

Figure 9:
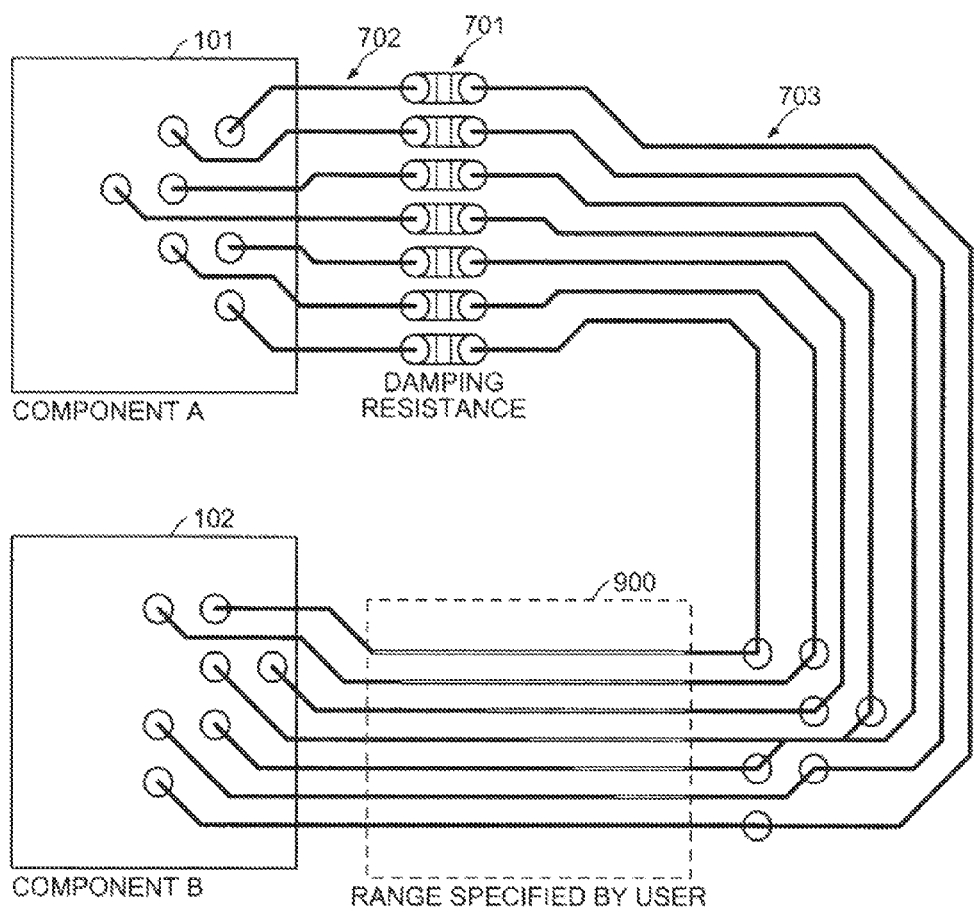
FIG. 9 is an explanatory diagram depicting a ninth display example.

FIG. 9 is an explanatory diagram of the ninth display example. While the first display example and the seventh display example illustrates a case where a non-complying line length is expressed on a path, the ninth display example illustrates an example of displaying a non-complying line length in an area 900 selected by a user. According to FIG. 9, in the selected area 900, it can be presented together to a designing engineer which wiring path violates the line length constraint, what the magnitude of the violation is when any violation of the line length constraint is present, and whether the violation is an excessive length or an insufficient length. Therefore, the designing engineer can intuitively grasp how much each of the paths should be shortened or extended to achieve the isometric wiring. Therefore, the wiring patterns can efficiently be edited to comply with the line length constraining condition.

Figure 10:
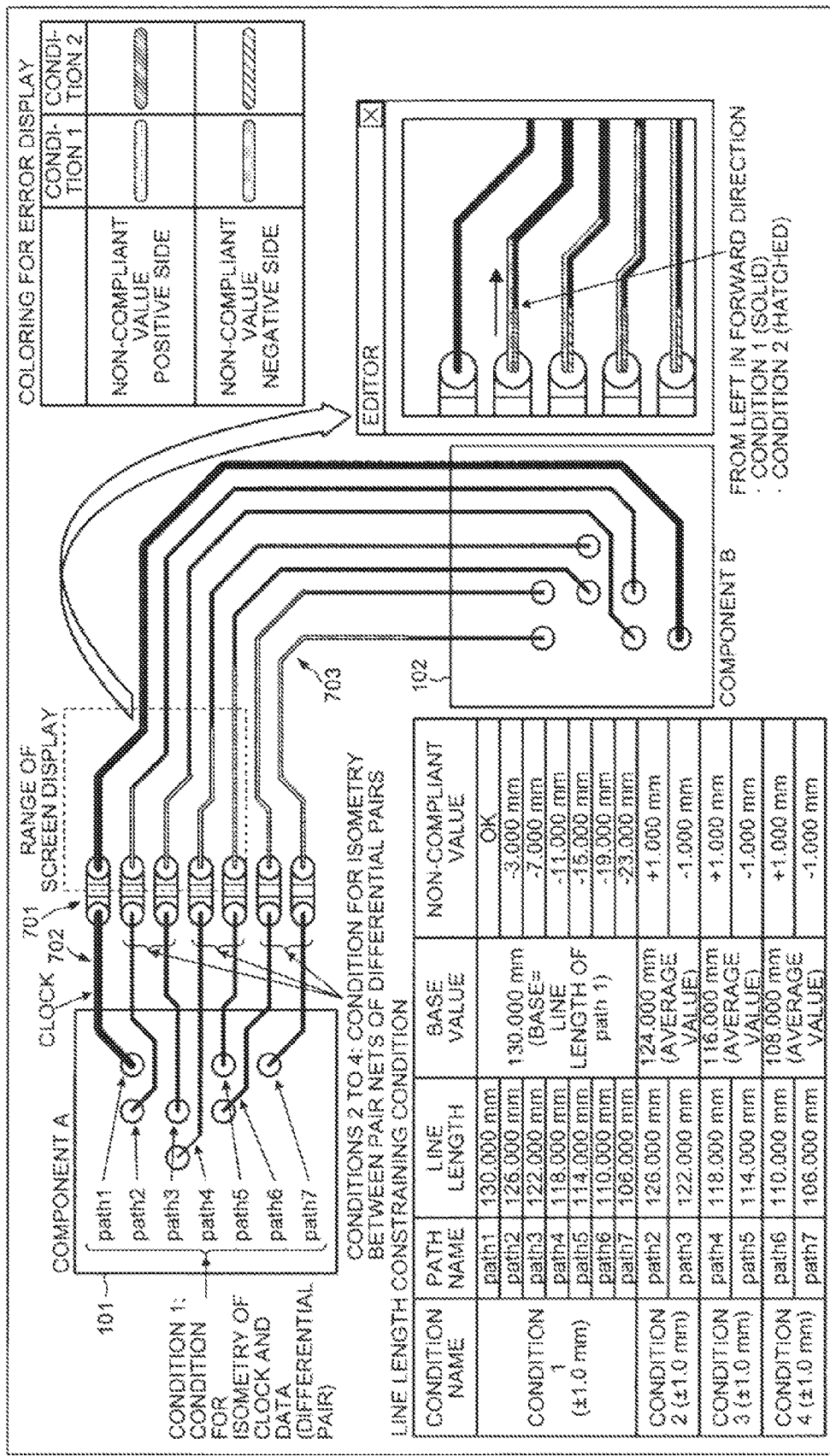
FIG. 10 is an explanatory diagram depicting a tenth display example.

FIG. 10 is an explanatory diagram of a tenth display example. Each of the first to ninth display examples has been described taking the example of the case where the one line length constraining condition is present. However, the tenth display example presents an exemplary display for the case where a plurality of line length constraining conditions (in FIG. 10, four conditions, conditions 1 to 4) are present. For example, the condition 1 denotes a line length constraining condition to cause wiring paths for the clock and data (differential pair) to be isometric. The conditions 2 to 4 each denote a line length constraining condition to cause wiring paths between pair nets of the differential pair to be isometric.

In the tenth display example, when the object area is magnified as in the eighth display example, each line is divided along the line width direction corresponding to the screen size so that non-complying line lengths under the line length constraining conditions are displayed. The number of times of dividing along the line width direction of each line depends on the screen size and, therefore, the number of divided lines may be limited and, thereby, the divided lines may be less than the line length constraining conditions. In this case, the divided lines are allocated to the non-complying line lengths according to the priority of each of the line length constraining conditions. In this manner, in the tenth display example, non-complying line lengths under the line length constraining conditions can simultaneously be checked in one screen.

As above, in the tenth display example, it can be presented together to a designing engineer which wiring path violates the line length constraint, what the magnitude of the violation is when any violation of the line length constraint is present, and whether the violation is an excessive length or an insufficient length. Therefore, the designing engineer can intuitively grasp how much each of the paths should be shortened or extended to achieve the isometric wiring. Therefore, the wiring patterns can efficiently be edited to comply with the line length constraining conditions.

Figure 11:
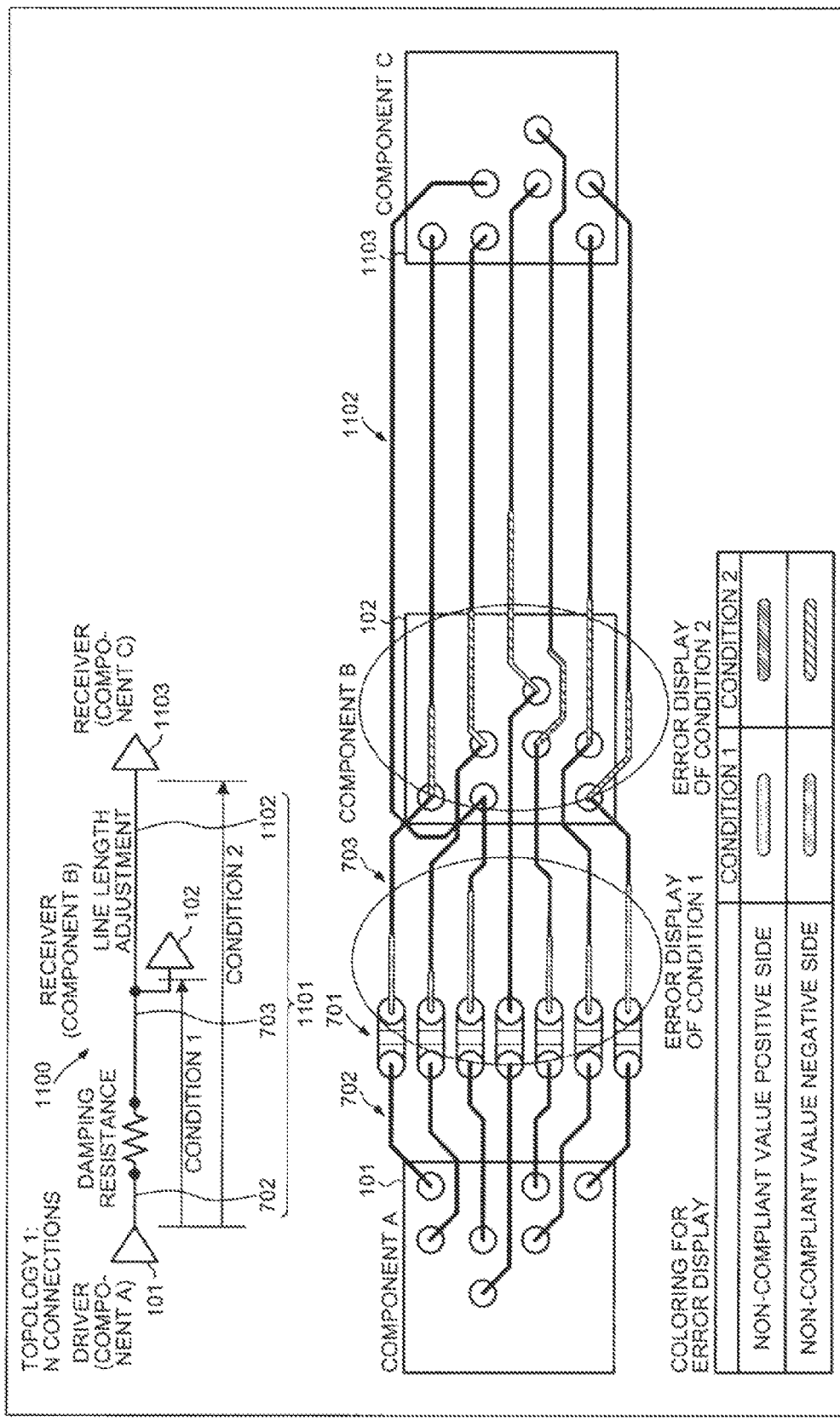
FIG. 11 is a block diagram depicting an eleventh display example.

FIG. 11 is a block diagram of the eleventh display example. In the eleventh display example, in the case where the calculation of non-complying line lengths is executed on the premise that the adjustment of the line lengths has been completed in advance, the line lengths are calculated assuming that the adjustment of the line lengths has been completed, even when the adjustment has not been completed of the line lengths of wiring patterns in a section that needs adjustment of the line lengths in advance. The non-complying line lengths are calculated using the result of the above calculation.

For example, in a topology 1100 depicted in FIG. 11, a line length constraining condition on the routes 702 and 703 between the driver 101 and the receiver 102 is denoted by "condition 1" and a line length constraining condition on a route 1101 between the driver 101 and a receiver 1103 is denoted by "condition 2". When a non-complying line length under the condition 2 is calculated, the calculation is executed assuming that the wiring paths have been adjusted to be isometric under the condition 1. Even when the line length adjustment under the condition 1 has not been completed, the non-complying line length under the condition 2 is calculated adding the length of the non-complying line length under the condition 1. Thereafter, line length adjustment is executed for a route 1102 between the receiver 102 and a receiver 1103.

In this manner, in the eleventh display example, even when the line length adjustment to be executed in the previous stage has not been completed, the non-complying line lengths under the line length constraining conditions can simultaneously be checked and, therefore, improvement of the efficiency of the line length adjustment can be facilitated.

Figure 12:
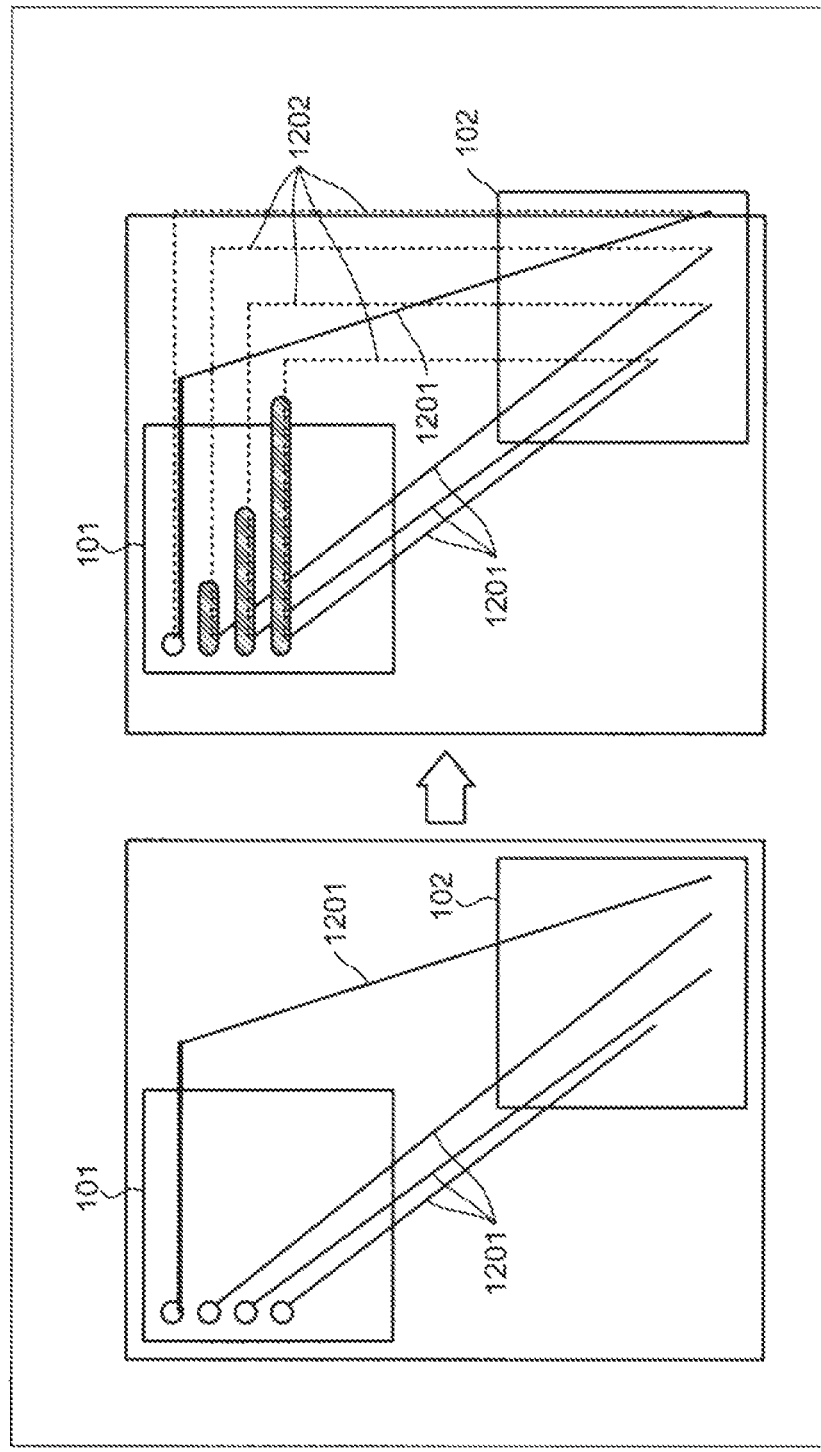
FIG. 12 is an explanatory diagram depicting a twelfth display example.

FIG. 12 is an explanatory diagram of the twelfth display example. The twelfth display example is an example where non-complying line lengths are displayed even when no wiring path is formed as a wiring pattern. More specifically, tentative routes (for example, Manhattan route 1202) are acquired from connection information (for example, rat's net 1201) of the wiring paths and the line lengths of the tentative routes of the wiring paths are acquired. The non-complying line lengths are acquired from the line lengths of the tentative routes and are displayed on the tentative paths. In this manner, according to the twelfth display example, substantial non-complying line lengths can be estimated even without executing detailed wiring, and improvement of the efficiency of the line length adjustment can be facilitated.

Figure 13:
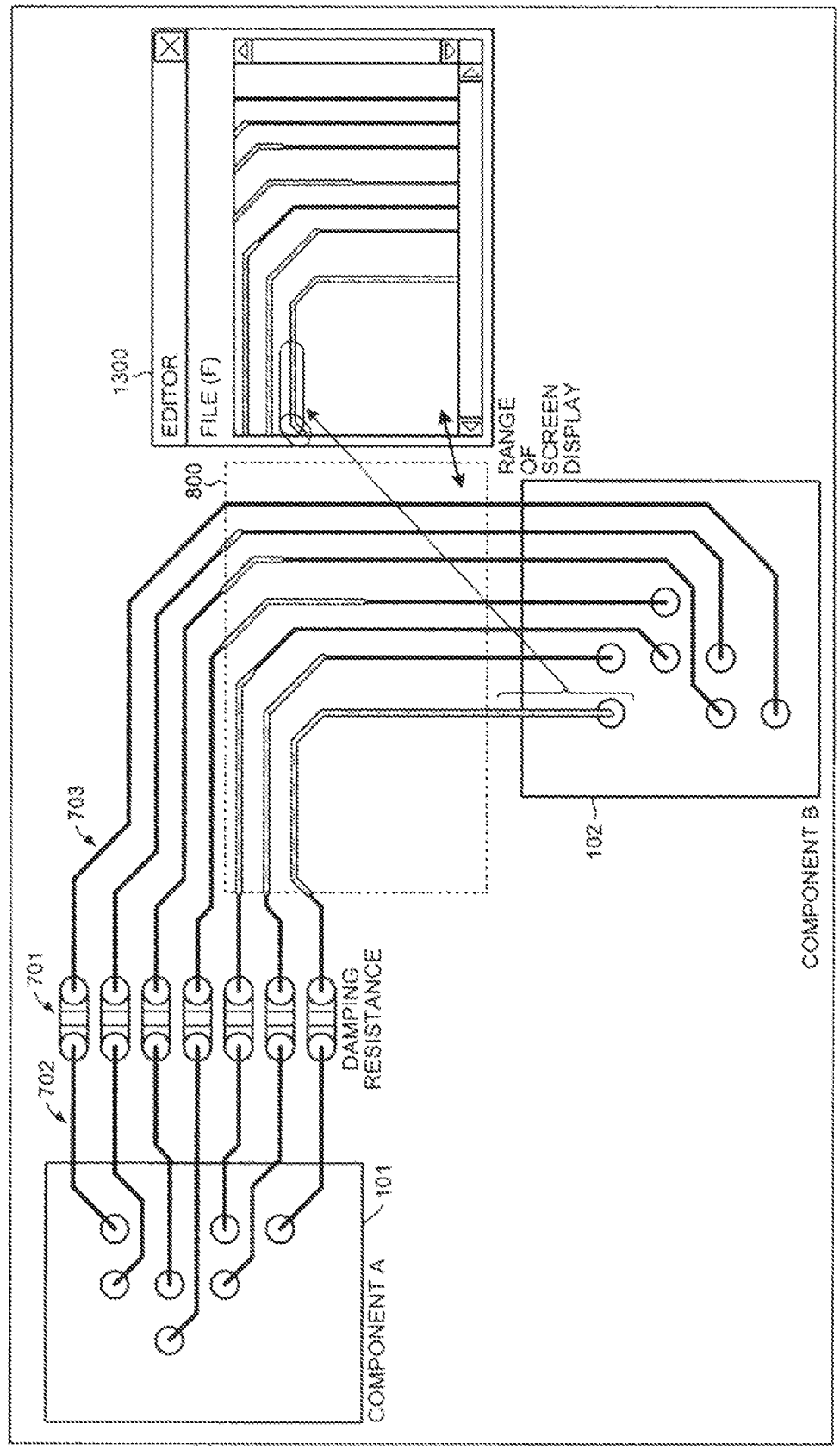
FIG. 13 is an explanatory diagram depicting a thirteenth display example.

FIG. 13 is an explanatory diagram of the thirteenth display example. The thirteenth display example is an exemplary display formed by combining at least two of the first to twelfth display examples. In FIG. 13, when an object area 800 is enlarged, a non-complying line length that is pushed out of the object area 800 may not be displayed in a display screen 1300. In this case, the whole length of the non-complying line length can be expressed including a part protruding from the area, by changing the line width, etc., and displaying a new graphic on the original line.

Figure 14:
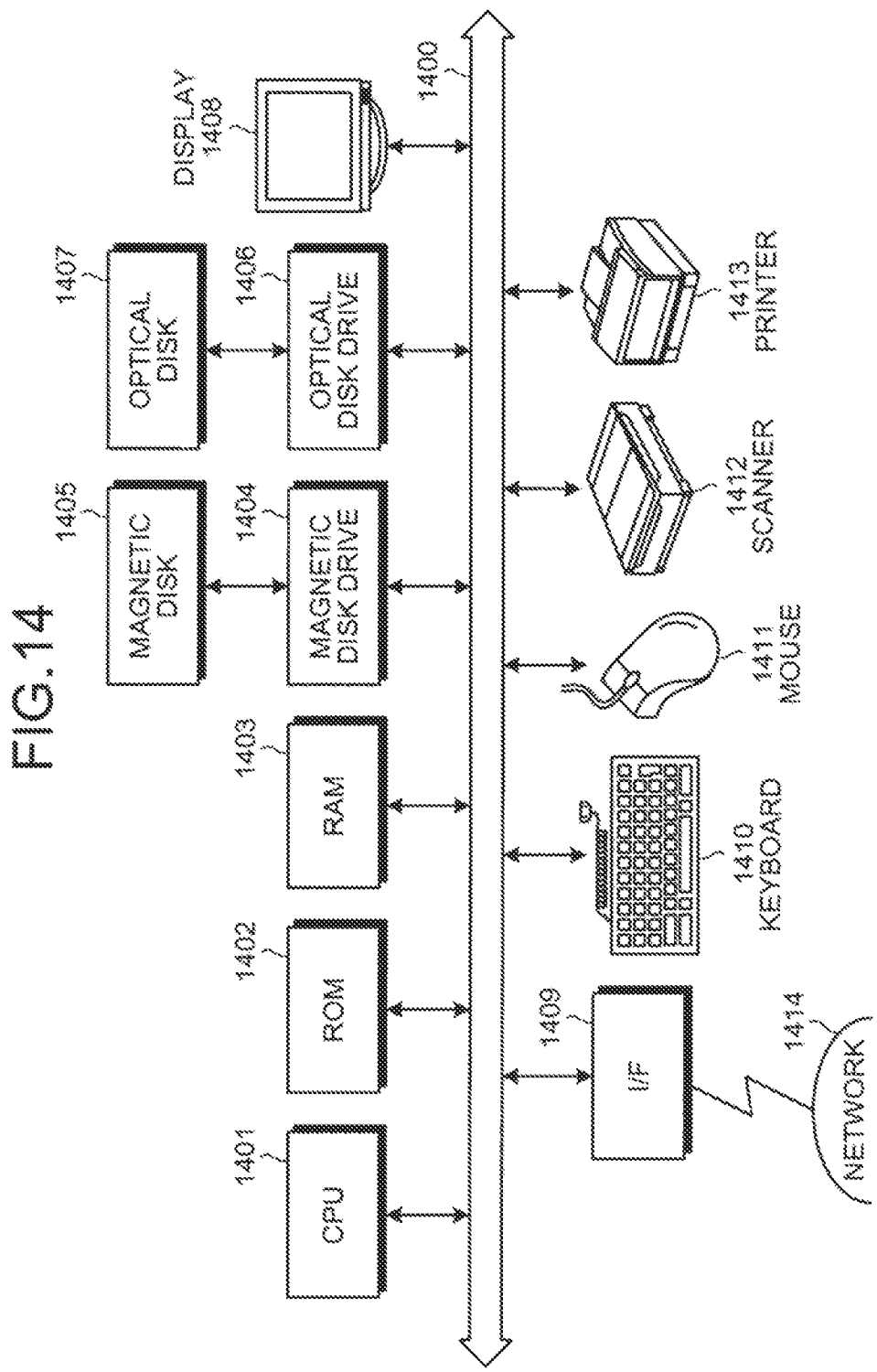
FIG. 14 is a block diagram depicting a hardware configuration of a design support apparatus according to embodiments.

FIG. 14 is a block diagram illustrating a hardware configuration of a design support apparatus according to the embodiments. In FIG. 14, the design support apparatus includes a central processing unit (CPU) 1401, a read-only memory (ROM) 1402, a random access memory (RAM) 1403, a magnetic disk drive 1404, a magnetic disk 1405, an optical disk drive 1406, an optical disk 1407, a display 1408, an interface (I/F) 1409, a keyboard 1410, a mouse 1411, a scanner 1412, and a printer 1413, connected to one another by way of a bus 400.

The CPU 1401 governs overall control of the design support apparatus. The ROM 1402 stores therein programs such as a boot program. The RAM 1403 is used as a work area of the CPU 1401. The magnetic disk drive 1404, under the control of the CPU 1041, controls reading/writing of data from or to the magnetic disk 1405. The magnetic disk 1405 stores therein the data written under the control of the magnetic disk drive 1404.

The optical disk drive 1406, under the control of the CPU 1401, controls reading/writing of data from or to the optical disk 1407. The optical disk 1407 stores therein the data written under the control of the optical disk drive 1406, the data being read by the computer.

The display 1408 displays a cursor, an icon, or a toolbox as well as data such as documents, images, and information on functions. The display 1408 may be, for example, a cathode ray tube (CRT), a thin-film-transistor (TFT) liquid crystal display, or a plasma display.

The I/F 1409 is connected to a network 1414 such as the Local Area Network (LAN), the Wide Area Network (WAN), and the Internet through a telecommunication line and is connected to other devices by way of the network 1414. The I/F 1409 manages the network 1414 and an internal interface, and controls the input and output of data from or to external devices. The I/F 1409 may be, for example, a modem or a LAN adapter.

The keyboard 1410 is equipped with keys for the input of characters, numerals, and various instructions, and data is entered through the keyboard 1410. The keyboard 1410 may be a touch-panel input pad or a numeric keypad. The mouse 1411 performs cursor movement, range selection, and movement, size change, etc., of a window. The mouse 1411 may be a trackball or a joystick provided the trackball or joystick has similar functions as a pointing device.

The scanner 1412 optically reads an image and takes in the image data into the design support apparatus. The scanner 1412 may have an optical character recognition (OCR) function as well. The printer 1413 prints image data and document data. The printer 1413 may be, for example, a laser printer or an ink jet printer.

Storage contents of various types of tables used in the embodiments will be described with reference to FIGS. 15 to 25. The tables below realize their functions by, for example, a storing apparatus such as the ROM 1402, the RAM 1403, the magnetic disk drive 1404 and the magnetic disk 1405, and the optical disk drive 1406 and the optical disk 1407 depicted in FIG. 14.

Figure 15:
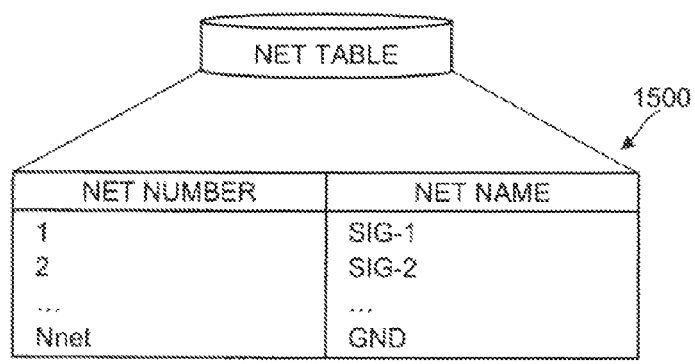
FIG. 15 is an explanatory diagram depicting a net table 1500.

FIG. 15 is an explanatory diagram illustrating a net table 1500. The net table 1500 is a table that correlates a net number identifying a net with a net name, for each net.

Figure 16:
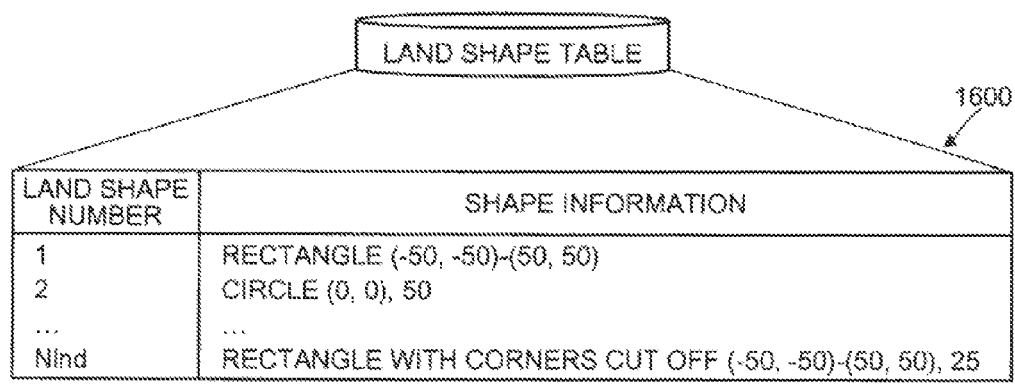
FIG. 16 is an explanatory diagram depicting a land shape table 1600.

FIG. 16 is an explanatory diagram illustrating a land shape tale 1600. The land shape table 1600 is a table that correlates a land shape number identifying a land with shape information concerning the land, for each land. The "shape information" is information that identifies a shape and, when the shape of a land is, for example, a rectangle, the shape information therefor includes (an identifier indicating) a rectangle and the coordinates of two diagonal vertexes. When the shape of a land is a circle, the shape information therefor includes (an identifier indicating) a circle, the coordinates of the center, and the radius.

Figure 17:
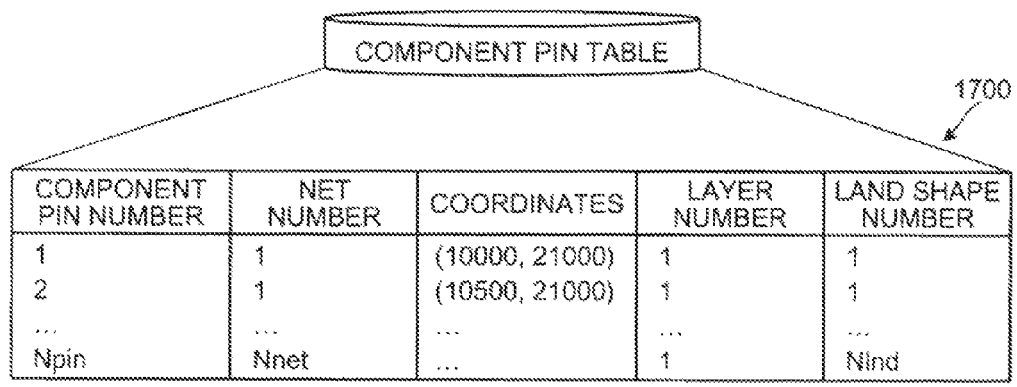
FIG. 17 is an exemplary diagram depicting a component pin table 1700.

FIG. 17 is an exemplary diagram illustrating a component pin table 1700. The component pin table 1700 is a table that correlates the component pin number identifying a component pin, the net number of a net to which the component pin belongs, the coordinate position of the component pin, the number of layer that the component pin is disposed in, and the corresponding land shape number with each other for each component pin.

FIG. 18 is an exemplary diagram illustrating a via table 1800. The via table 1800 is a table that correlates the via number identifying a via, the net number of net to which the via belongs, the coordinate position of the via, the number of layer that the via is disposed in, and the corresponding land shape number with each other for each via.

FIG. 19 is an exemplary diagram illustrating a line table 1900. The line table 1900 is a table that correlates the line number identifying a line, the net number of a net to which the line belongs, the From-To coordinate positions of the line, the width of the line, and the number of layer where the line is wired, with each other for each line. When drawing is executed according to the widths of the lines, a wiring pattern is acquired.

FIG. 20 is an exemplary diagram illustrating a line length constraining condition table 2000. The line length constraining condition table 2000 is a table that correlates the constraining condition number identifying a line length constraining condition, line length condition information, line length base information, a wiring path number list, and the display control number, with each other for each line length constraining condition. The "line length condition information" indicates the range that is permitted by the line length constraining condition, and a wiring path that complies with the line length condition information is the base path and a wiring path that does not comply with the information is a non-complying path.

The "constraining condition number" corresponds to the condition name depicted in FIG. 1 or 10. The "line length base information" is information that indicates the base of a wiring path to be constrained. For example, when a specific wiring path is set to be the base, the wiring path number of this wiring path (for example, the wiring path number 2) is set. In this case, the wiring path that is identified with the wiring path number is the base path. Otherwise, the average line length of the wiring paths to be constrained may be the line length base information. A value acquired from the line length base information corresponds to the base value for the line length constraining condition depicted in FIG. 1 or 10.

The "wiring path number list" is a list that lists the wiring path numbers each identifying a wiring path on which the line length constraining condition is imposed. The line length base information is set based on the wiring path number list. For example, a specific wiring path number used as the line length base information is selected from the wiring path number list. Similarly, the average wiring path line length used as the line length base information is the average line length of a wiring path group specified by the wiring path number list.

FIG. 21 is an exemplary diagram illustrating a wiring path table 2100. The wiring path table 2100 is a table that correlates the wiring path number that identifies a wiring path, a wiring connection order element list, a line length, and line length judgment information with each other for each wiring path.

The "wiring path number" corresponds to the path name in the line length constraining condition depicted in FIG. 1 or 10. The "wiring connection order element list" is a list that cites wiring elements such as a component pin and a via in order of connection. The "line length" refers to the line length of a wiring path and corresponds to the line length in the line length constraining condition depicted in FIG. 1 or 10. The "line length judgment information" is information that indicates the result of a judgment as to whether a wiring path complies with a line length constraining condition. When the result of the judgment is "OK", the wiring path complies with the line length constraining condition. When the result of the judgment is a numerical value, the wiring path does not satisfy the condition. When the numerical value is a positive value, the value indicates excess and, when the numerical value is a negative value, the value indicates insufficiency.

FIG. 22 is an exemplary diagram illustrating a display path table 2200. The display path table 2200 correlates the line length number, a logical line length, a tentative line length, tentative line length judgment information, a display section number list, an identical path list, and the parent path number with each other for each display path. The "display path" is a path whose non-complying line length is to be displayed as an error, of the wiring paths.

The "line length number" corresponds to the identical wiring path number of the wiring path table 2100 depicted in FIG. 21. The "logical line length" is the line length that is calculated when an unwired section is present in a display path. The "tentative line length" refers to a tentative line length of a display path that is calculated taking into consideration the line length acquired from the line length judgment information of the wiring path table 2100 against the line length of a wiring path that is the display path.

The "tentative line length judgment information" is information that indicates the result of a judgment as to whether the tentative line length of the display path complies with the line length constraining condition. When the result of the judgment is "OK", the tentative line length complies with the line length constraining condition. When the result of the judgment is a numerical value, the tentative line length does not satisfy the condition. When the numerical value is a positive value, the value indicates excess and, when the numerical value is a negative value, the value indicates insufficiency.

The "display section number list" is information that lists display section numbers of a display section table 2300. Thereby, the display path has display sections in order of the listed numbers. The "identical path list" is information that lists the wiring path numbers of the wiring paths whose constraining conditions are different from that of the listed display path while whose wiring connection order element lists are the same as those of the display paths. The "parent path number" is the wiring path number of a wiring path that is the parent path of the display path. The "parent path" refers to a wiring path whose driver is common to its display path and that is the shortest one of the wiring paths that include its display path.

FIG. 23 is an exemplary diagram illustrating the display section table 2300. The display section table 2300 is a table that correlates the display section number that identifies a display section, a section color, a section line width, a line type, a graphic type, and a display section with each other for each display section. The "display section" is a route that is an object for the adjustment and refers to, for example, the route 702 between the driver 101 and the damping resistance 701. The "section color" is a rendering color for a display section. The "section line width" is a line width used for a non-complying line length to be drawn in the display section. The "line type" is the type of line for a non-complying line length to be drawn in the display section. The "graphic type" is the type of graphic used for a non-complying line length to be drawn in the display section.

Figure 24:
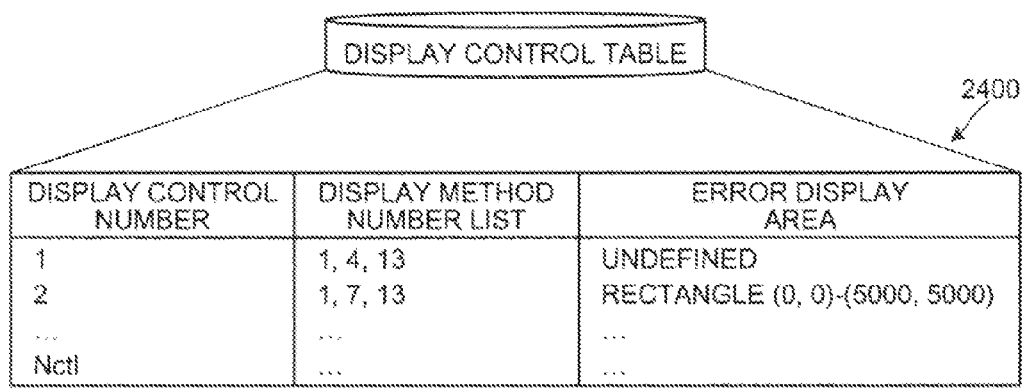
FIG. 24 is an exemplary diagram depicting a display control table 2400.

FIG. 24 is an exemplary diagram illustrating a display control table 2400. The display control table 2400 is a table that correlates a display control number that identifies a display control content, a displaying method number list that describes the details of the display control content, and an error display area that is the non-complying line length, with each other for each display control content. The "display control content" is information to determine how and where an error of a non-complying line length is displayed. The "displaying method number list" is a list that lists the numbers to identify displaying methods. The displaying method will be described with reference to FIG. 25. The "error display area" is an area to identify the area where the error is displayed.

FIG. 25 is an exemplary diagram illustrating a display method table 2500. The displaying method table 2500 is a table that correlates the displaying method number that identifies a displaying method, and a displaying method with each other for each displaying method. In this example, the "displaying method number" corresponds to the numbers (the exemplary display numbers) of first to thirteenth display examples respectively depicted in FIGS. 1 to 13.

A procedure of a design support process according to the embodiments is explained.

FIG. 26 is a flowchart of a design support process according to the embodiments. Working tables are initialized (step S2601). The "working tables" are the display path table 2200 and the display section table 2300. More specifically, items in the display path table 2200 and the display section table 2300 are all set to be undefined.

A logical route wiring length calculating process (step S2602), a constraining condition interpreting process (step S2603), a tentative line length judging process (step S2604), a display section determining process (step S2605), and a section displaying process (step S2606) are executed. Thereby, the series of steps come to an end. Detailed processes executed at steps S2603 to S2606 will be described.

FIG. 27 is a flowchart of the detail of the logical route wiring length calculating process (step S2602) depicted in FIG. 26. The logical route wiring length calculating process (step S2602) is a process of setting the "logical line length" item of the display path table 2200 depicted in FIG. 22 and, therefore, is executed only when the twelfth display example is executed.

A constraining condition number Ca is first set to be Ca=1 (step S2701). It is determined whether Ca>Ncod (the total number of line constraining conditions) (step S2702). When a condition of Ca>Ncod is not satisfied (step S2702: NO), the index number PI of the list is set as PI=1 (step S2703). It is determined whether PI is larger than the number of numerals in the wiring path number list in the constraining condition Ca (step S2704).

When PI is equal to or smaller than the number of numerals in the wiring path number list (step S2704: NO), a PI-th value Pa in the wiring path number list is set as Pa=1 (step S2705). It is determined whether the wiring of a wiring path Pa has been completed (step S2706). In other words, it is determined whether the wiring path Pa has been drawn as a wiring pattern.

When it is determined that the wiring has been completed (step S2706: YES), the procedure moves to step S2712. On the other hand, when it is determined that the wiring has not been completed (step S2706: NO), the wiring path table 2100 is referred to and, thereby, a wired section line length La of the wiring path Pa is extracted (step S2707). The wiring path table 2100 is referred to and, thereby, an unconnected section Pb of the wiring path Pa is extracted (step S2708).

For example, when Pa=1, when wiring has been completed for a route from a component pin 1 to a via 1, the route length from the component pin 1 to the via 1 is calculated as the wired section line length La of the wiring path Pa. A route from the via 1 to a component pin 8 is unconnected and, therefore, the route from the via 1 to the component pin 8 is extracted as the unconnected section Pb of the wiring path Pa. A Manhattan length Lb of the unconnected section Pb extracted is calculated (step S2709).

Thereafter, the wired section line length La and the Manhattan length Lb of the unconnected section Pb are summed and, thereby, a logical line length Lab of the wiring path Pa is acquired (step S2710). The logical line length Lab is written into a record of the wiring path number Pa in the display path table 2200 (step S2711). In this manner, the logical line length Lab is set in the display path table 2200 for each wiring path Pa.

Thereafter, at step S2712, PI is incremented (step S2712) and the procedure returns to step S2704. When it is determined at step S2704 that PI is larger than the number of numerals (step S2704: YES), the constraining condition number Ca is incremented (step S2713) and it is determined whether Ca>Ncod (the total number of the line length constraining conditions) (step S2702).

When Ca>Ncod (step S2702: YES), the logical route wiring length calculating process (step S2602) is completed and the procedure moves to the constraining condition interpreting process (step S2603).

Figure 30:
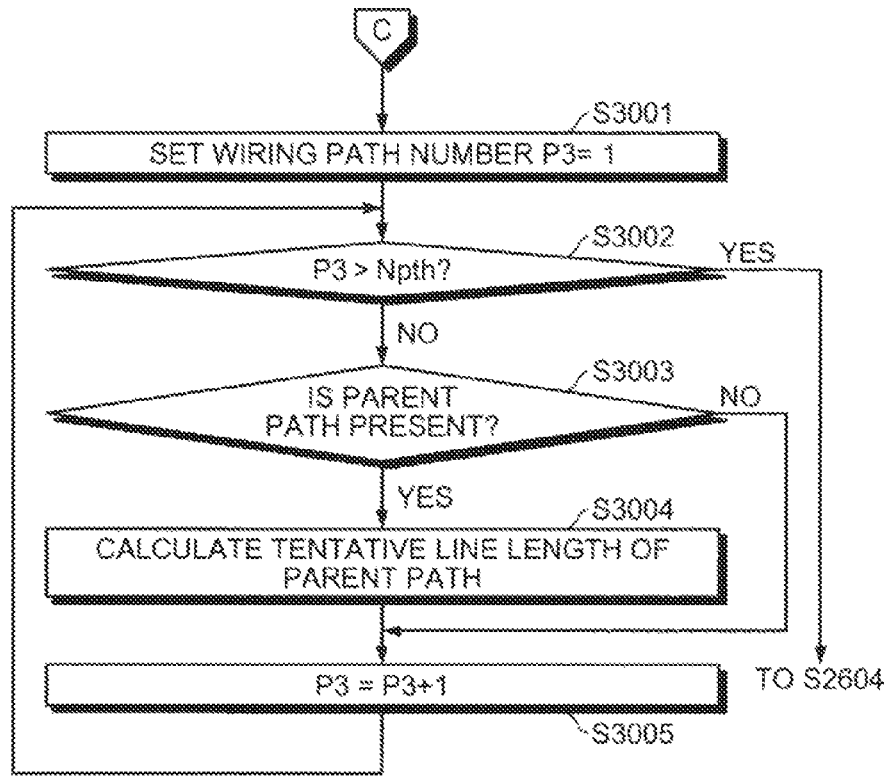
FIG. 30 is a flowchart depicting details of a constraining condition interpreting process (step S2603) depicted in FIG. 26.

FIGS. 28 to 30 are flowcharts illustrating the detail of the constraining condition interpreting process (step S2603) depicted in FIG. 26. The constraining condition interpreting process (step S2603) is a process of setting an "identical path list" item, a "path number list" item, and a "tentative line length" item in the display path table 2200 and, therefore, is executed only when the tenth or eleventh display example is executed.

In FIG. 28, a first constraining condition number C1 is set as C1=1 (step S2801) and it is determined whether C1>Ncod (the total number of line length constraining conditions) (step S2802). When C1>Ncod (step S2802: YES), the procedure moves to step S3001 of FIG. 30.

On the other hand, when a condition of C1>Ncod is not met (step S2802: NO), it is determined whether any unselected wiring path number is present in the wiring path number list of the constraining condition C1 in the line length constraining condition table 2000 (step S2803). When an unselected wiring path number is present (step S2803: YES), an unselected wiring path number is extracted as "P1" (step S2804).

The procedure moves to step S2900 of FIG. 29. On the other hand, when it is determined at step S2803 that no unselected wiring path number is present (step S2803: NO), the first constraining condition number C1 is incremented (step S2805) and the procedure returns to step S2802.

In FIG. 29, a second constraining condition number C2 is set as C2=1 (step S2900) and it is determined whether C2>Ncod (the total number of line length constraining conditions) (step S2901). When C2>Ncod (step S2901: YES), the procedure moves to step S2803 of FIG. 28.

When a condition of C2>Ncod is not met (step S2901: NO), it is determined whether any unselected wiring path number is present in the wiring path number list of the constraining condition C2 in the line length constraining condition table 2000 (step S2902). When an unselected wiring path number is present (step S2902: YES), an unselected wiring path number is extracted as "P2" (step S2903).

It is determined whether C1≠C2 and P1=P2 (step S2904). It is determined whether two line length constraining conditions (C1 and C2) are present for identical wiring paths. When conditions of C1≠C2 and P1=P2 are not satisfied (step S2904: NO), the procedure moves to step S2906. On the other hand, when C1≠C2 and P1=P2 (step S2904: YES), the identical path list for the wiring path P1 (=P2) is updated (step S2905). More specifically, in the display path table 2200, a wiring path number P1 (=P2) is written in the identical path list of a record for the line length number P1 that corresponds to the wiring path number P1.

It is determined whether C1≠C2 and P1 ⊂ P2 (step S2906). It is determined whether the wiring path P1 is a portion of the wiring path P2 when the line length constraining conditions are different. When conditions of C1≠C2 and P1 ⊂ P2 are not satisfied (step S2906: NO), the procedure returns to step S2902. On the other hand, when C1≠C2 and P1⊂P2 (step S2906: YES), the parent path number of the wiring paths P1 and P2 is collected and, thereby, a wiring path set M1 is set (step S2907).

When the parent path number is undefined, the wiring path set M1 is set as M1={P1, P2} at step S2907. When the wiring paths P1 and P2 have their parent path, the parent path is included in the wiring path set M1.

The wiring paths in the wiring path set M1 are sorted in order of increasing line length (step S2908). The parent path number is identified from the wiring path set M1 after the sorting and, thereby, the display path table 2200 is updated (step S2909). The procedure returns to step S2902. When it is determined at step S2902 that no unselected wiring path number is present (step S2902: NO), the second constraining condition number C2 is incremented (step S2910) and the procedure returns to step S2901.

In FIG. 28, when C1>Ncod (step S2802: YES), the procedure moves to step S3001 of FIG. 30. At step 3001, the wiring path number P3 is set as P3=1 (step S3001) and it is determined whether P3>Npth (step S3002). When a condition of P3>Npth is not satisfied (step S3002: NO), it is determined whether the wiring path P3 has a parent path (step S3003).

When the wiring path P3 has a parent path (step S3003: YES), a tentative line length of the parent path is calculated (step S3004) and the procedure moves to step S3005. On the other hand, when the wiring path P3 has no parent path (step S3003: NO), the procedure moves to step S3005. At step S3005, the wiring path number P3 is incremented (step S3005) and the procedure moves to step S3002. When P3>Npth (step S3002: YES), the constraining condition interpreting process (step S2603) comes to an end and the procedure moves to the tentative line length judging process (step S2604).

A specific example of the constraining condition interpreting process (step S2603) will be described. Exemplary updating of a parent path number in the display path table 2200 will be described with reference to FIGS. 31, 32, 33A, 33B, 33C, 33D, and 33E.

Figure 31:
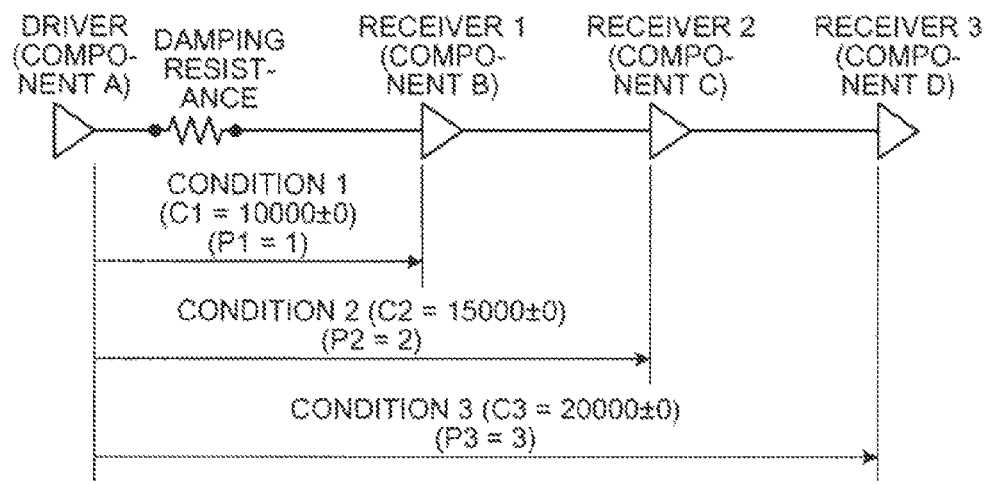
FIG. 31 is an explanatory diagram of a topology for an exemplary updating of a parent path number in the display path table 2200.
Figure 32:
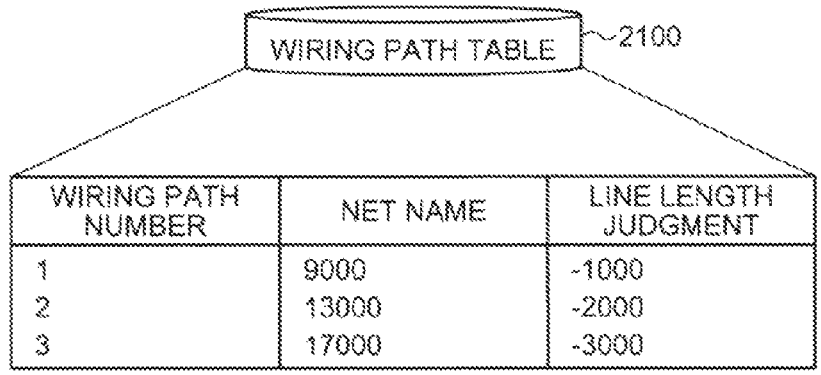
FIG. 32 is an explanatory diagram of the content of the wiring path table 2100 that corresponds to the topology of FIG. 31.
Figure 33A:
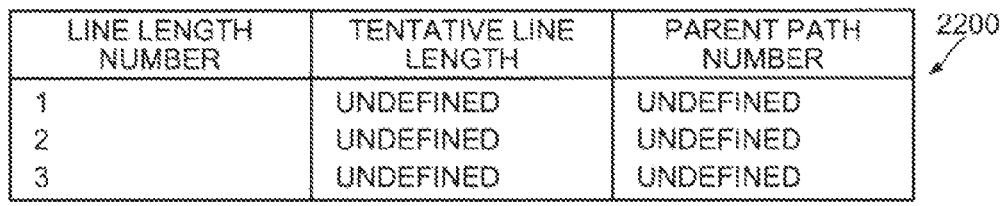
FIG. 33A is an explanatory diagram of exemplary updating of the display path table 2200.

FIG. 31 is an explanatory diagram of an example of a topology to explain the exemplary updating of the parent path number in the display path table 2200. FIG. 32 is an explanatory diagram of the content of the wiring path table 2100 that corresponds to the topology of FIG. 31. FIGS. 33A, 33B, 33C, 33D, and 33E are explanatory diagrams of exemplary updating of the display path table 2200. As to the wiring path table 2100 and the display path table 2200, some items are excerpted. FIG. 33A depicts an initial state of the display path table 2200.

In the case where P1=1 and P2=2, the display path table 2200 has an undefined parent path number for the line length number 1 that corresponds to the wiring path number 1 (=P1) is undefined. Similarly, the parent path number of the line length number 2 that corresponds to the wiring path number 2 (=P2) is also undefined. Therefore, the wiring path set M1 is given as M1={P1, P2}={1, 2}.

When the wiring path set M1 is sorted in order of increasing line length, the wiring path set M1 is obtained as M1={P1, P2}={1, 2}. In the wiring path set M1, a number on the right-hand side is the parent of a number on the left-hand side of the adjacent wiring path numbers. Therefore, the parent path of the wiring path number 1 is the wiring path number 2. Thereby, as depicted in FIG. 33B, "2" is written in the parent path number of the line length number 1 that corresponds to the wiring path number 1 in the display path table 2200.

Figure 33B:
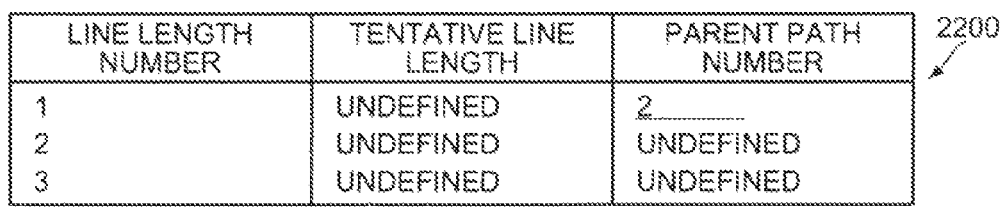
FIG. 33B is an explanatory diagram of exemplary updating of the display path table 2200.

When P1=1 and P2=3, the parent path number 2 of P1 in addition to P1 and P3 as the wiring path set M1 is cited from the display path table 2200 of FIG. 33B. Thereby, the wiring path set M1 is given as M1={P1, P3, P2}={1, 3, 2}.

Figure 33C:
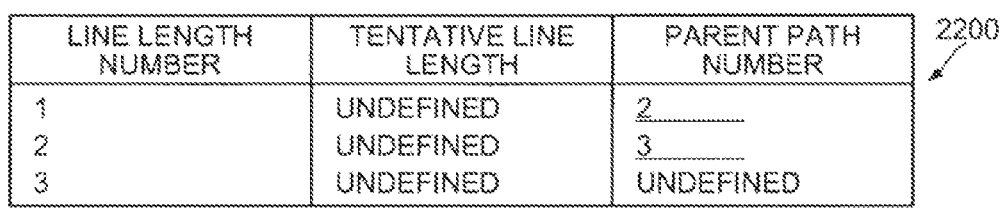
FIG. 33C is an explanatory diagram of exemplary updating of the display path table 2200.

When the wiring path set M1 is sorted in order of increasing line length, M1={1, 2, 3}. In the wiring path set M1, a number on the right-hand side is the parent of a number on the left-hand side of the adjacent wiring path numbers. Therefore, the parent path of the wiring path number 2 is the wiring path number 3. Thereby, as depicted in FIG. 33C, "3" is written in the parent path number of the line length number 2 that corresponds to the wiring path number 2 in the display path table 2200.

Thereafter, as described at step S3004, a tentative line length of the parent path is acquired. When P3=1, the parent path number of the wiring path P3 (=1) is "2" and, therefore, the line length judgment information "–1,000" of the wiring path P3 (=1) is subtracted from the line length "13,000" of the wiring path number 2 that is the parent path number 2 and, thereby, the tentative line length "14,000 (=13,000–(–1,000))" of the wiring path number (line length number) 2 can be acquired. As depicted in FIG. 33D, "14,000" is written in the tentative line length of the line length number 2.

When P3=2, the parent path number of the wiring path P3 (=2) is "3" and, therefore, the line length judgment information "–2,000" of the wiring path P3 (=2) is subtracted from the line length "17,000" of the wiring path number 3 that is the parent path number 3 and, thereby, the tentative line length "19,000 (=17,000–(–2,000))" of the wiring path number (line length number) 3 can be acquired. As depicted in FIG. 33E, "19,000" is written in the tentative line length of the line length number 3.

In this example, because the tentative line length is undefined, the line length of the wiring path table 2100 is applied. However, when the logical line length is set in the display path table 2200, the logical line length is used instead of the line length. When the tentative line length has already been acquired, the tentative line length is set as it is without using the line length judgment information.

Figure 34:
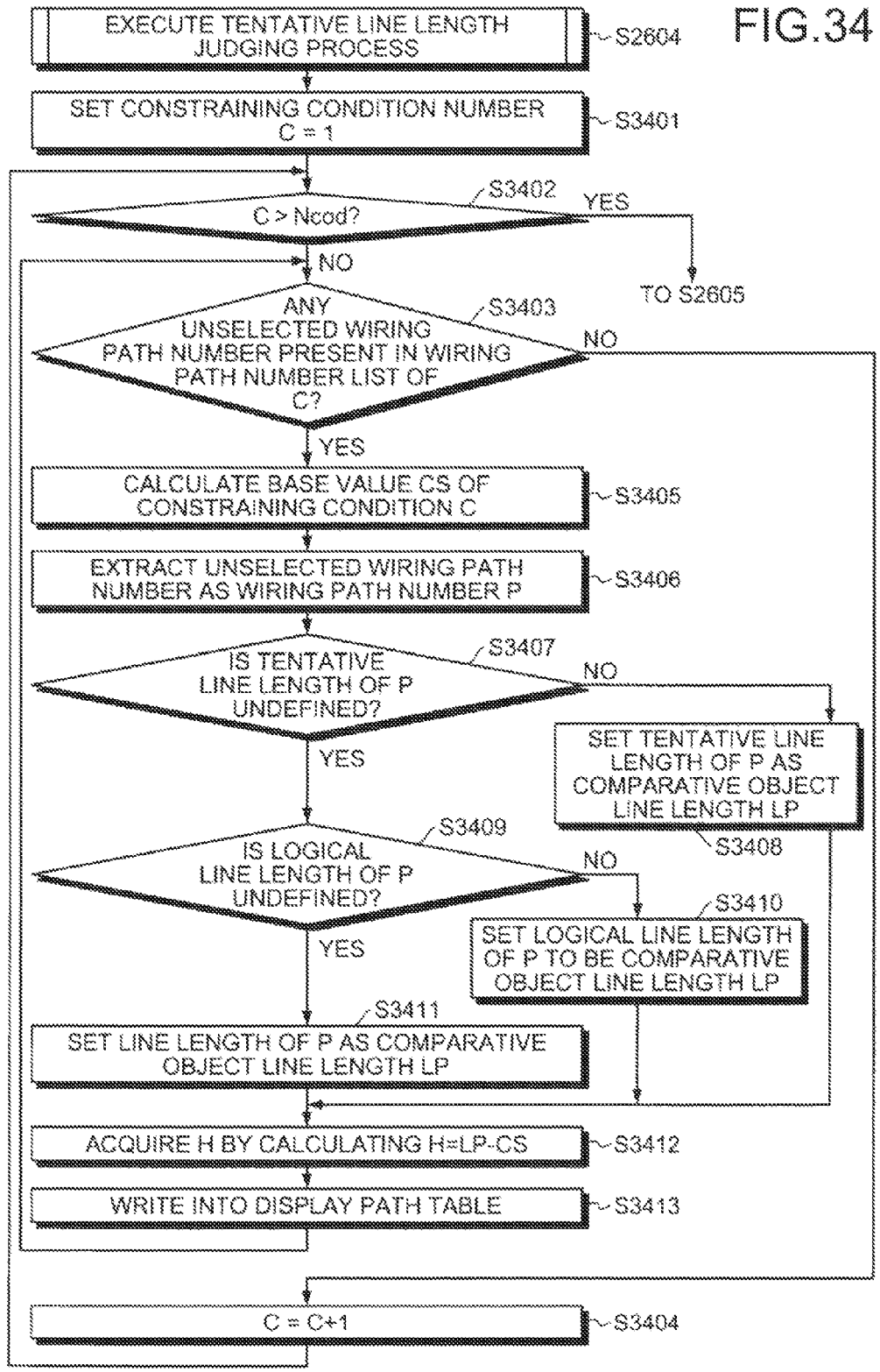
FIG. 34 is a flowchart of the detail of a tentative line length judging process (step S2604) depicted in FIG. 26.

FIG. 34 is a flowchart of the detail of the tentative line length judging process (step S2604) depicted in FIG. 26. The tentative line length judging process (step S2604) is a process of setting the "tentative line length judgment information" item of the display path table 2200 and, therefore, is executed only when the eleventh or twelfth display example is executed.

The constraining condition number C is set as C=1 (step S3401). It is determined whether C>Ncod (the total number of the line length constraining conditions) (step S3402). When a condition of C>Ncod is not met (step S3402: NO), it is determined whether any unselected wiring path number is present in the wiring path number list of the constraining condition number C (step S3403). When no unselected wiring path number is present (step S3403: NO), the constraining condition number C is incremented (step S3404) and the procedure returns to step S3402.

When C>Ncod (the total number of the line length constraining conditions) at step S3402 (step S3402: YES), the procedure moves to step S2605. On the other hand, when it is determined that an unselected wiring path number is present (step S3403: YES), a base value CS of the constraining condition C is calculated (step S3405). More specifically, the line length base information of the line length constraining condition table 2000 is referred to and, thereby, the base value CS (the line length of a specific wiring path and the average line length of the wiring paths to be constrained) is calculated.

Thereafter, the unselected wiring path number P at step S3403 is extracted (step S3406). It is determined whether the tentative line length of the wiring path number P (=line length number P) selected is undefined in the display path table 2200 (step S3407). When tentative line length is not undefined (step S3407: NO), the tentative line length of the wiring path number P is set as a comparative object line length LP (step S3408) and the procedure moves to step S3412.

On the other hand, when the tentative line length of the wiring path number P (=line length number P) selected is undefined (step S3407: YES), it is determined whether the logical line length of the wiring path number P (=line length number P) selected is undefined (step S3409). When the logical line length is not undefined (step S3409: NO), the logical line length of the wiring path number P is set to be the comparative object line length LP (step S3410) and the procedure moves to step S3412.

On the other hand, when the logical line length of the wiring path number P (=line length number P) selected is undefined (step S3409: YES), the line length of the wiring path number P is set to be the comparative object line length LP (step S3411) and the procedure moves to step S3412.

At step S3412, the tentative line length judgment information H is acquired by calculating H=LP−CS. The tentative line length judgment information H acquired is written in a record of the wiring path number P (=line length number P) of the display path table 2200 (step S3413) and the procedure returns to step S3403.

FIG. 35 is an explanatory diagram of the display path table 2200 into which the tentative line length judgment information is written. The display path table 2200 of FIG. 35 illustrates an update of FIG. 33E. For example, the base value acquired when P=3 is "20,000" and, therefore, the tentative line length "19,000" is insufficient by "1,000". Therefore, the tentative line length judgment information H is H=−1,000.

Referring back to FIG. 34, when it is determined at step S3402 C>Ncod (step S3402: YES), the tentative line length judging process (step S2604) comes to an end and the procedure moves to the display section determining process (step S2605).

Figure 36:
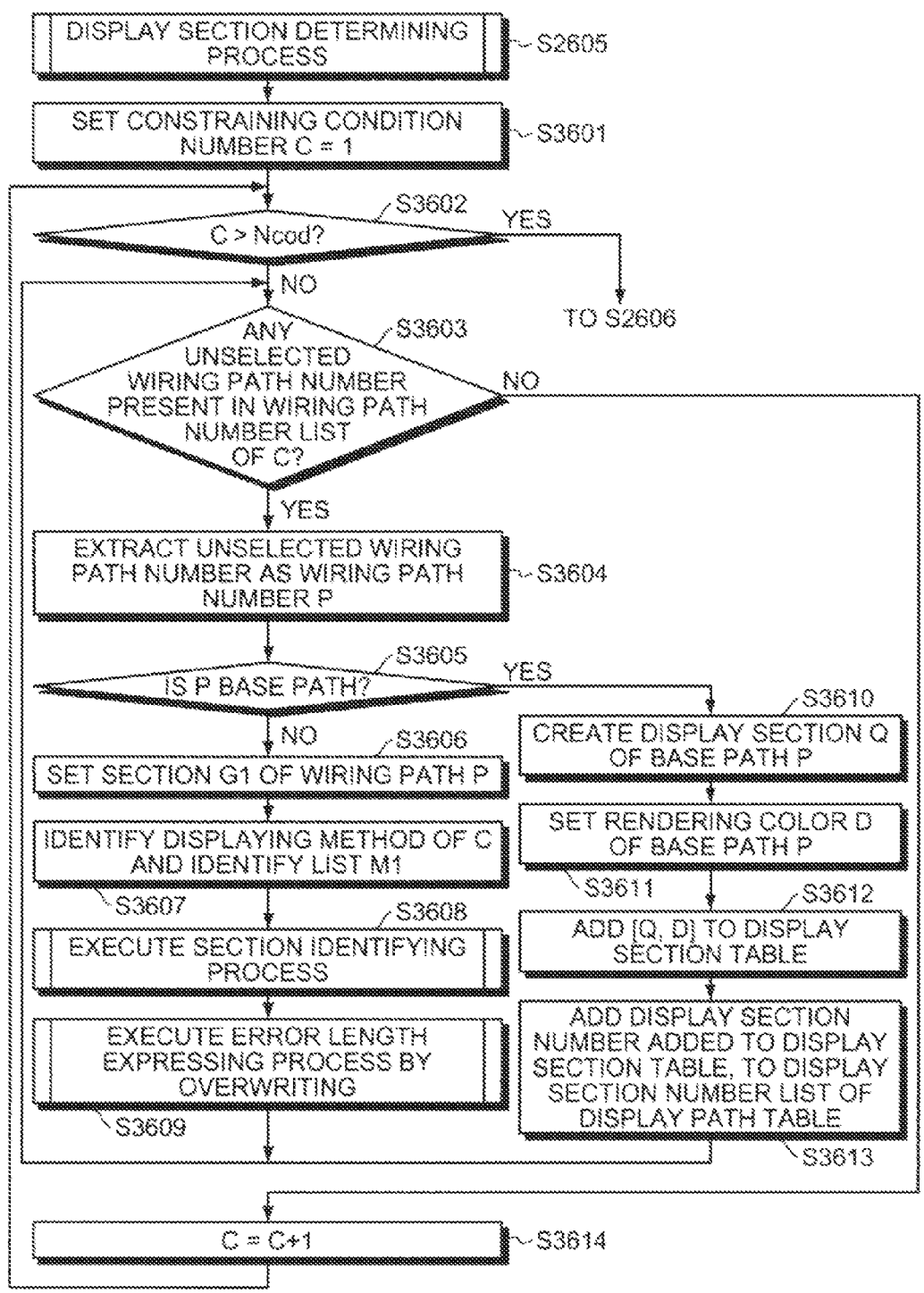
FIG. 36 is a flowchart depicting the detail of a display section determining process (step S2605) depicted in FIG. 26.

FIG. 36 is a flowchart illustrating the detail of the display section determining process (step S2605) depicted in FIG. 26. The display section determining process (step S2605) creates the display section table 2300.

The constraining condition number C is set as C=1 (step S3601). It is determined whether C>Ncod (the total number of the line length constraining conditions) (step S3602). When a condition of C>Ncod is not met (step S3602: NO), it is determined whether any unselected wiring path number is present in the wiring path number list of the constraining condition number C (step S3603). When no unselected wiring path number is present (step S3603: NO), the constraining condition number C is incremented (step S3614) and the procedure returns to step S3602.

On the other hand, when an unselected wiring path number is present (step S3603: YES), the unselected wiring path number is extracted as an unselected wiring path number P (step S3604) and it is determined whether the wiring path number P is the base path (step S3605). More specifically, the wiring path table 2100 depicted in FIG. 21 is referred to and, thereby, it is determined whether the line length judgment information of the wiring path of the wiring path number P (hereinafter, "wiring path P") is OK. When the line length judgment information is OK, the wiring number P is the base path.

When it is determined that the wiring path number P is not the base path (step S3605: NO), a section G1 of the wiring path P is set (step S3606). More specifically, an element of the wiring connection order element list of the wiring path P is put into the section G1. The display control table 2400 is referred to from the display control number of the constraining condition C and a display method number list M1 is identified (step S3607). Thereafter, a section identifying process (step S3608) and an error length expressing process by overwriting (step S3609) are executed and the procedure returns to step S3603. The section identifying process (step S3608) and the error length expressing process by overwriting (step S3609) will be described later.

On the other hand, when it is determined at step S3605 that the wiring path number P is the base path (step S3605: YES), a display section Q of the base path P is created (step S3610). A rendering color D for the base path P is set (step S3611). At this step, the rendering color D is the rendering color D that is set in advance.

[Q, D] is added to the display section table 2300 (step S3612). More specifically, the "D" and the "Q" are respectively written into the "section color" item and the "display section" item of the record of a specific display section number. The display section number that is added with the [Q, D] is added to the display section number list of the record of the base path P of the display path table 2200 (step S3613). Thereafter, the procedure returns to step S3603.

On the other hand, when C>Ncod at step S3602 (step S3602: YES), the display section determining process (step S2605) comes to an end and the procedure moves to the section displaying process (step S2606).

Figure 37:
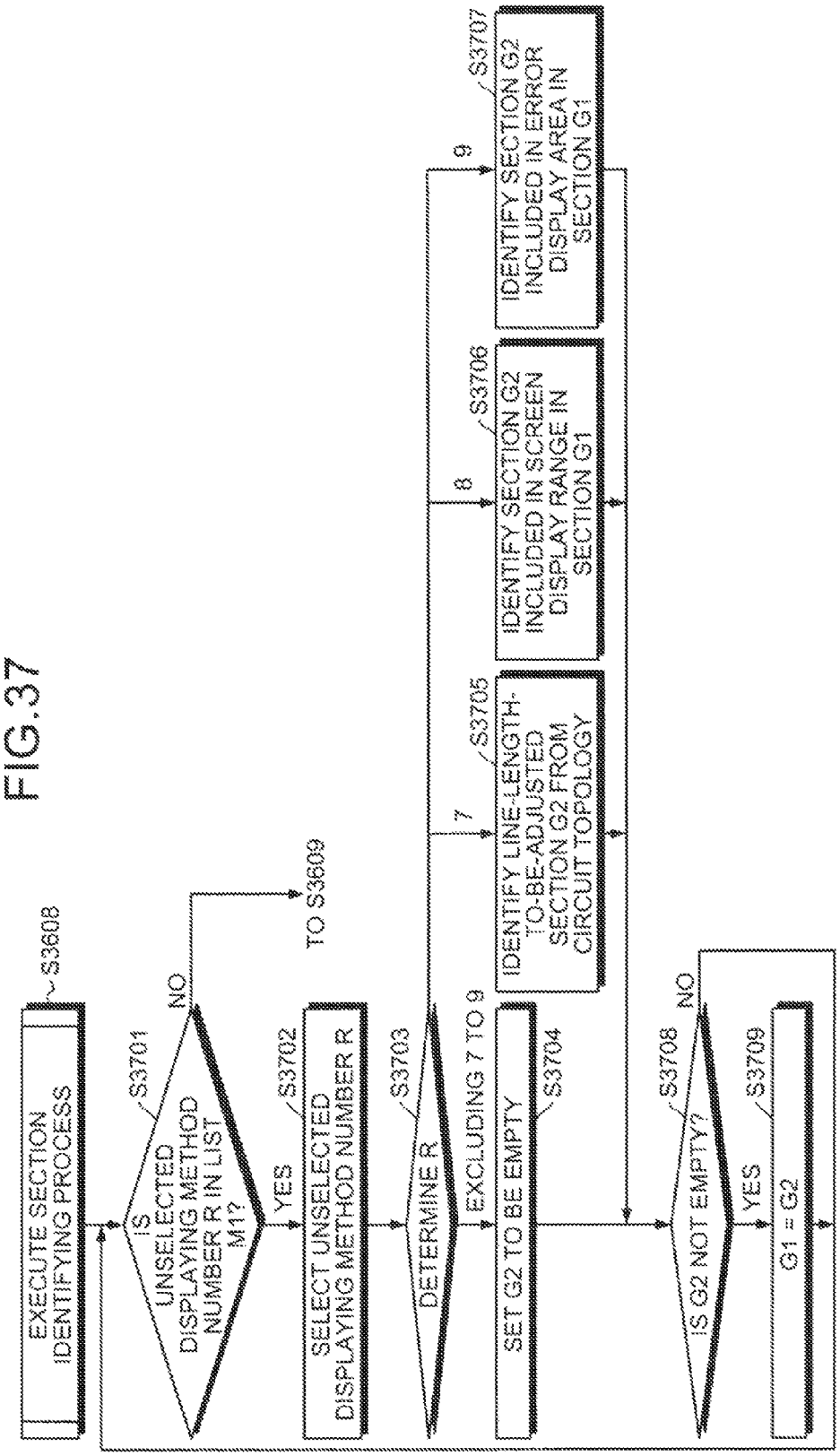
FIG. 37 is a flowchart depicting the detail of a section identifying process (step S3608) depicted in FIG. 36.

FIG. 37 is a flowchart illustrating the detail of the section identifying process (step S3608) depicted in FIG. 36. It is first determined whether any unselected displaying method number R is present in the displaying method number list M1 acquired at step S3607 (step S3701). When an unselected displaying method number R is present (step S3701: YES), the unselected displaying method number R is selected (step S3702). It is determined whether the selected displaying method number R is a number other than seven to nine, R=7, R=8, or R=9 (step S3703).

When the number R is a number other than seven to nine (step S3703: excluding seven to nine), a line length adjustment object section G2 is set to be empty (step S3704) and the procedure moves to step S3708.

When R=7 (step S3703: seven), the line length adjustment object section G2 is identified from the topology of the wiring path P (step S3705) and the procedure moves to step S3708. More specifically, a circuit topology database (DB) is used. The circuit topology DB has stored therein various kinds of topologies each having a line length adjustment object section designated therefor. Therefore, a topology is retrieved that coincides with the topology of the wiring path P from the circuit topology DB and the line length adjustment object section designated for the topology retrieved is extracted. The line length adjustment object section extracted is identified as G2.

When R=8 (step S3703: eight), the section G2 is identified that is included in a screen display range in the section G1 of the wiring path P (step S3706) and the procedure moves to step S3708. For example, the section G2 is detected that is included in the object area 800 depicted in FIG. 8 of the section G1 of the wiring path P.

When R=9 (step S3703: nine), the section G2 is identified that is included in an error display area in the section G1 of the wiring path P (step S3707) and the procedure moves to step S3708. For example, the section G2 is detected that is included in the selected range 900 depicted in FIG. 9 of the section G1 of the wiring path P.

At step S3708, it is determined whether the section G2 is not empty (step S3708). When the section G2 is empty (step S3708: NO), the procedure returns to step S3701. On the other hand, when the section G2 is not empty (step S3708: YES), the section G1 of the wiring path P is set to be a line length adjustment object section G2 (step S3709) and the procedure returns to step S3701. When no unselected displaying method number R is present (step S3701: NO), the procedure moves to the error length expressing process by overwriting (step S3609).

Figure 38:
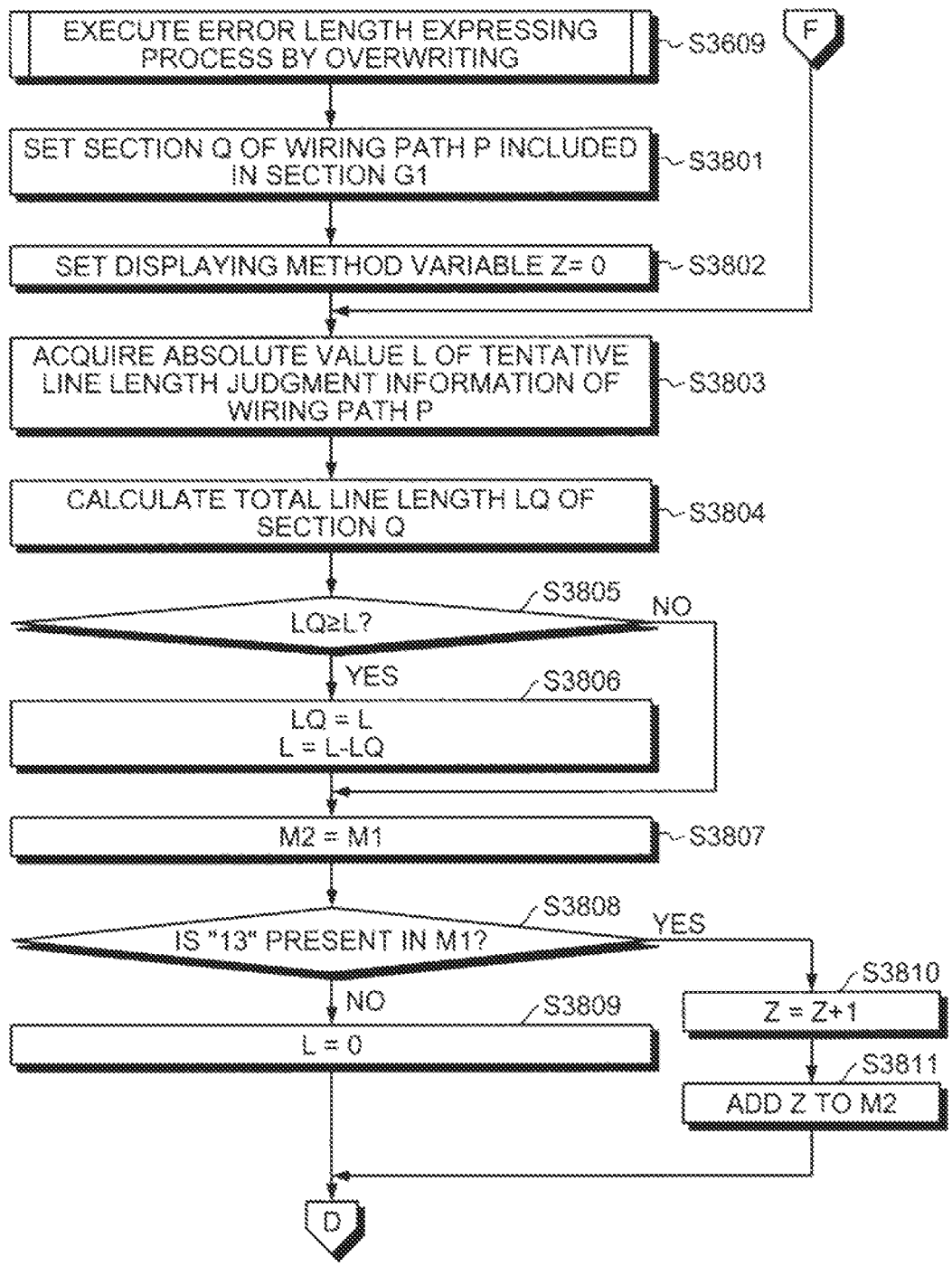
FIG. 38 is a flowchart depicting details of an error length expressing process by overwriting (step S3609) depicted in FIG. 36.
Figure 39:
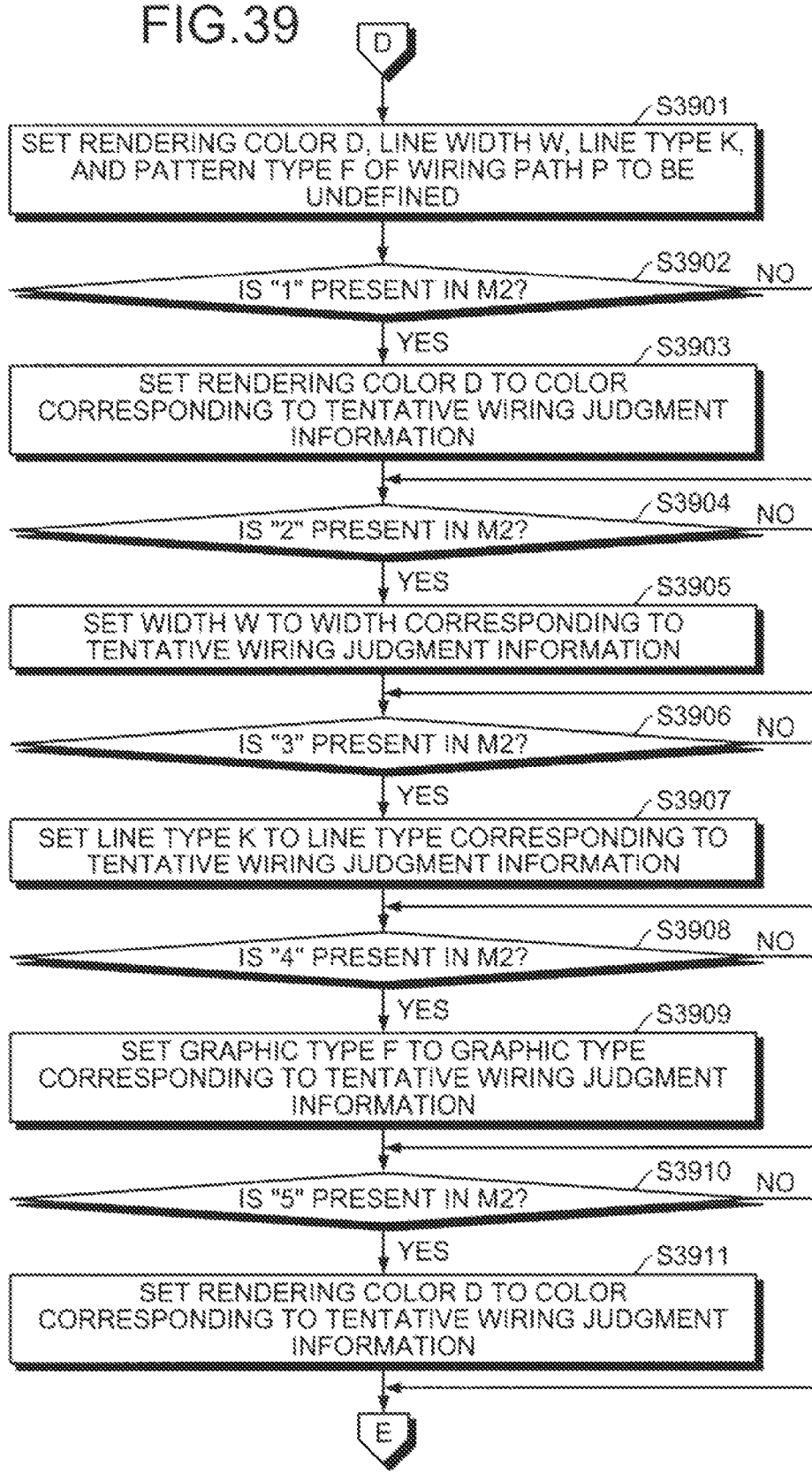
FIG. 39 is a flowchart depicting details of an error length expressing process by overwriting (step S3609) depicted in FIG. 36.
Figure 40:
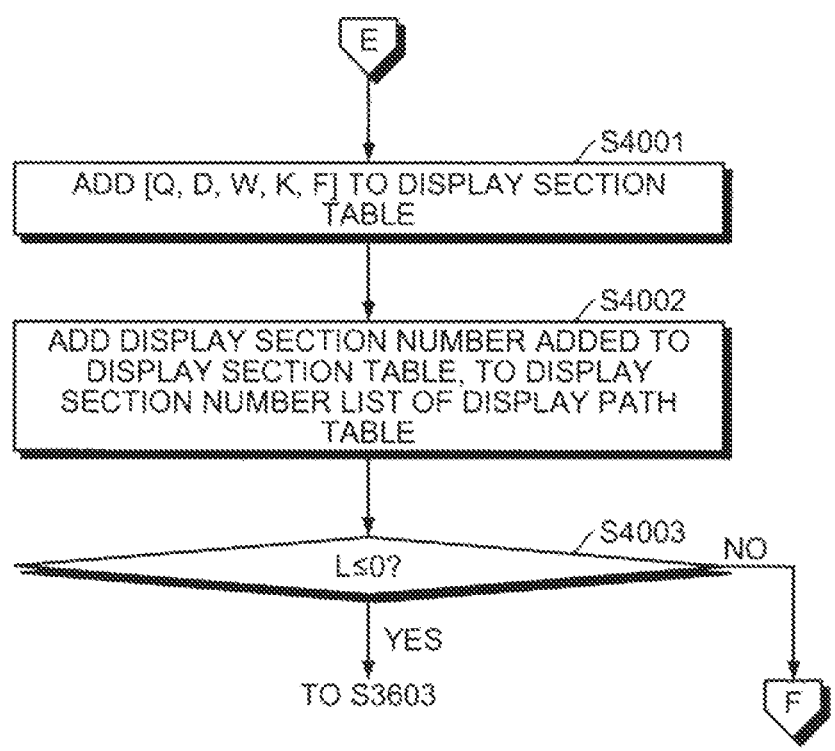
FIG. 40 is a flowchart depicting details of an error length expressing process by overwriting (step S3609) depicted in FIG. 36.

FIGS. 38 to 40 are flowcharts illustrating the detail of the error length expressing process by overwriting (step S3609) depicted in FIG. 36. A section Q is set that is included in the section G1 of the wiring path P that is not the base path (step S3801). For example, when P=1, the wiring path number 1 of FIG. 21 is correlated with "component pin 1, via 1, via 8, and component pin 8" and, therefore, each of sections [component pin 1, via 1], [via 1, via 8], and [via 8, component pin 8] is set to be the section Q.

A displaying method variable Z is set as Z=0 (step S3802). The absolute value L of the tentative line length judgment information of the wiring path P is acquired (step S3803). A total line length LQ of the section Q is calculated (step S3804). It is determined whether LQ≧L (step S3805).

When a condition of LQ≧L is not met (step S3805: NO), the procedure moves to step S3807. On the other hand, when LQ≧L (step S3805: YES), the total line length LQ is set as LQ=L and the absolute value L of the tentative line length judgment information is set as L=L−LQ (step S3806). Because LQ is set as LQ=L, the coordinate of the section Q is varied corresponding thereto. The variation may be realized by various processes. For example, only the section at the tail of the section Q may be shortened or the whole section Q may evenly be shortened.

The displaying method number list M2 is set as M2=M1 (step S3807). It is determined whether the displaying method number R=13 is present in the displaying method number list M1 (step S3808). When the displaying method number R=13 is not present (step S3808: NO), the absolute value L is set as L=0 (step S3809) and the procedure moves to step S3901 of FIG. 39.

On the other hand, when the displaying method number R=13 is present in the displaying method number list M2 (step S3808: YES), the displaying method variable Z is incremented (step S3810) and the display method variable Z is added to M2 (step S3811) and the procedure moves to step S3901 of FIG. 39.

In FIG. 39, the rendering color D, the line width W, the line type K, and the graphic type F are set to be undefined of the wiring path P in the display section table 2300 (step S3901). It is determined whether the displaying method number R=1 is present in the displaying method number list M2 (step S3902). If it is determined that the displaying method number R=1 is not present (step S3902: NO), the procedure moves to step S3904.

On the other hand, when it is determined that the displaying method number R=1 is present (step S3902: YES), the rendering color D is set to be a rendering color that corresponds to the tentative wiring judgment information of the wiring path P (step S3903) and the procedure moves to step S3904. For example, FIG. 25 indicates that "a line length error display is performed with a color changed for only the length that corresponds to the non-complying line length" when R=1 and that the color is "red" for insufficiency (negative value) and "blue" for excess (positive value). Therefore, when the tentative wiring judgment information is a positive value, the color is set to be blue for the length corresponding to the non-complying line length and, when the tentative wiring judgment information is a negative value, the color for such a line is set to be red.

At step S3904, it is determined whether the displaying method number R=2 is present in the displaying method number list M2 (step S3904). When the displaying method number R=2 is not present (step S3904: NO), the procedure moves to step S3906.

On the other hand, when it is determined that the displaying method number R=2 is present (step S3904: YES), the line width W is set to be a line width that corresponds to the tentative wiring judgment information of the wiring path P (step S3905) and the procedure moves to step S3906. For example, FIG. 25 indicates that "a line length error display is performed with a width changed for only the length that corresponds to the non-complying line length" when R=2 and that the width is "narrow" for insufficiency (negative value) and "wide" for excess (positive value). Therefore, when the tentative wiring judgment information is a positive value, the width is set to be wider than other parts for the length corresponding to the non-complying line length and, when the tentative wiring judgment information is a negative value, the width for such a line is set to be narrower. An actual width may be set beforehand.

At step S3906, it is determined whether the displaying method number R=3 is present in the displaying method number list M2 (step S3906). When the displaying method number R=3 is not present (step S3906: NO), the procedure moves to step S3908.

On the other hand, when it is determined that the displaying method number R=3 is present (step S3906: YES), the line type K is set to be a line type that corresponds to the tentative wiring judgment information of the wiring path P (step S3907) and the procedure moves to step S3908. For example, FIG. 25 indicates that "a line length error display is performed with a line type changed for only the length that corresponds to the non-complying line length" when R=3 and that the line type is a dotted line for insufficiency (negative value) and a shaded line for excess (positive value). Therefore, when the tentative wiring judgment information is a positive value, the line type is set to be a shaded line for the length corresponding to the non-complying line length and, when the tentative wiring judgment information is a negative value, the line type for such a line is set to be a dotted line.

At step S3908, it is determined whether the displaying method number R=4 is present in the displaying method number list M2 (step S3908). When the displaying method number R=4 is not present (step S3908: NO), the procedure moves to step S3910.

On the other hand, when it is determined that the displaying method number R=4 is present (step S3908: YES), the graphic type F is set to be a graphic type that corresponds to the tentative wiring judgment information of the wiring path P (step S3909) and the procedure moves to step S3910. For example, FIG. 25 indicates that "a line length error display is performed with a graphic type overlapped for only the length that corresponds to the non-complying line length" when R=4 and that a graphic type is "graphic 1 (a line having width=0 is overwritten)" for insufficiency (negative value) and "graphic 2 (outline of elongated circle is overwritten)" for excess (positive value). Therefore, when the tentative wiring judgment information is a positive value, the graphic type is set to be graphic 2 for the length corresponding to the non-complying line length and, when the tentative wiring judgment information is a negative value, the line type for such a line is set to be graphic 1.

At step S3910, it is determined whether the displaying method number R=5 is present in the displaying method number list M2 (step S3910). When the displaying method number R=5 is not present (step S3910: NO), the procedure moves to step S4001 of FIG. 40.

On the other hand, when the displaying method number R=5 is present (step S3910: YES), the rendering color D is set to be a rendering color that corresponds to the tentative wiring judgment information of the wiring path P (step S3911) and the procedure moves to step S4001. More specifically, for example, FIG. 25 indicates that "an error is displayed over the whole wiring path by a color that corresponds to the non-complying line length" when R=5 and the rendering color is a "cold color" for insufficiency (negative value) or a "warm color" for an excess (positive value). Therefore, when the tentative wiring judgment information is a positive value, the whole wiring path is set to be in a warm color and, when the tentative wiring judgment information is a negative value, the whole wiring path is set to be in a cold color. As depicted in FIG. 5, the cold color and the warm color change in a stepwise manner according to the value of the tentative wiring judgment information.

In FIG. 40, [Q, D, W, k, F], a combination of the section Q, the rendering color D, the line width W, the line type K, and the graphic type F is added to the record of the display section number designated in the display section table 2300 (step S4001).

At step S4001, the display section number of the record having the display section table 2300 to which [Q, D, W, K, F] is added is added to the display section number list of the record of the wiring path P of the display path table 2200 (step S4002). It is determined whether L≦0 (step S4003). When L≦0 (step S4003: YES), no unadjusted non-complying line length is present and, therefore, the procedure returns to step S3603 of FIG. 36. On the other hand, when a condition of L≦0 is not met (step S4003: NO), an unadjusted non-complying line length is still present and, therefore, the procedure returns to step S3803 of FIG. 38.

Figure 41:
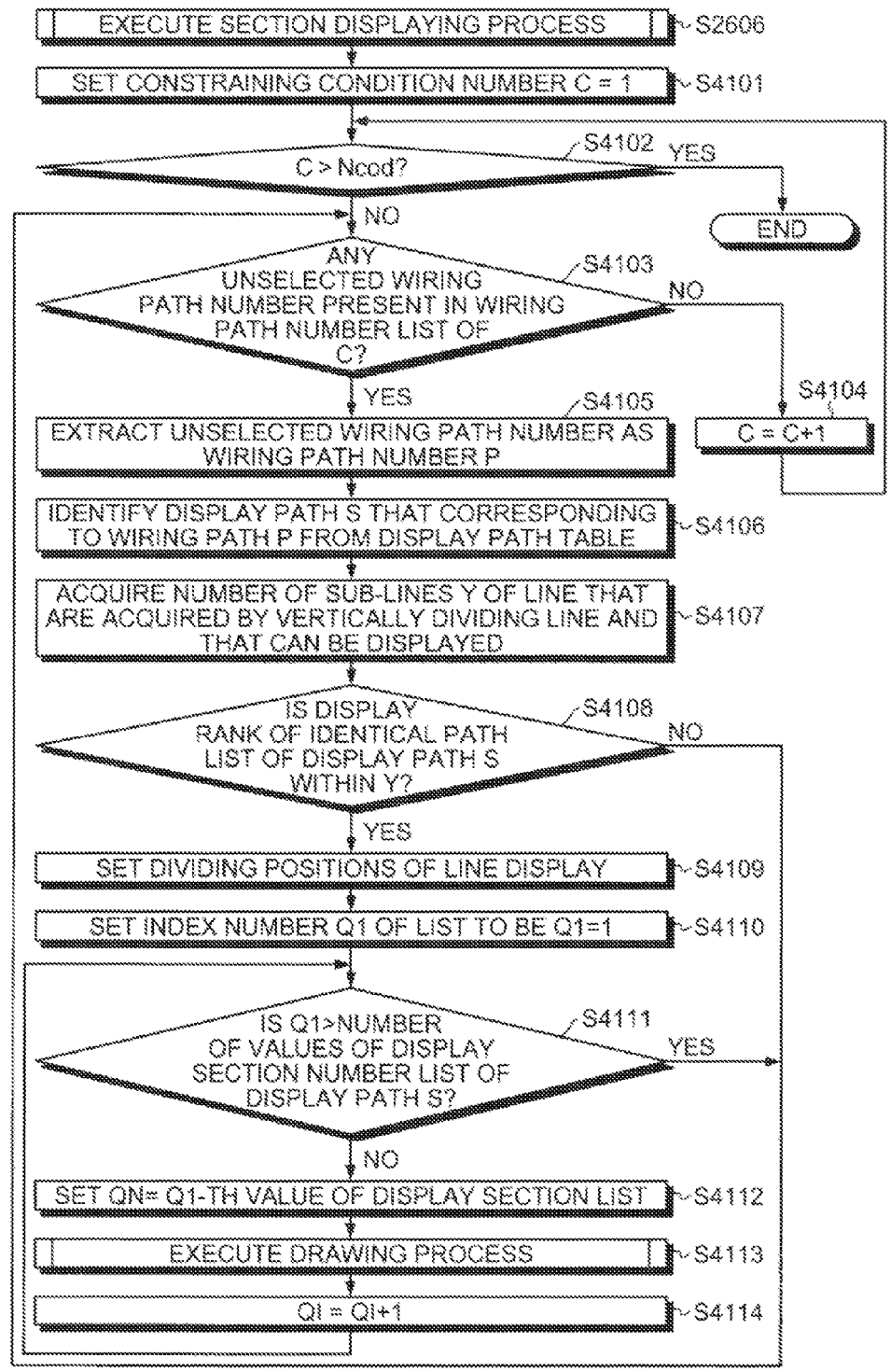
FIG. 41 is a flowchart depicting the detail of a section displaying process (step S2606) depicted in FIG. 26.

FIG. 41 is a flowchart illustrating the detail of the section displaying process (step S2606) depicted in FIG. 26. The constraining condition number C is set as C=1 (step S4101). It is determined whether C>Ncod (the total number of the line length constraining conditions) (step S4102). When a condition of C>Ncod is not met (step S4102: NO), it is determined whether any unselected wiring path number is present in the wiring path number list of the constraining condition number C (step S4103). When no unselected wiring path number is present (step S4103: NO), the constraining condition number C is incremented (step S4104) and the procedure returns to step S4102.

On the other hand, at step S4103, when it is determined that an unselected wiring path number is present (step S4103: YES), the unselected wiring path number is extracted as the unselected wiring path number P (step S4105) and a display path S is identified that corresponds to the wiring path P from the display path table 2200 (step S4106). More specifically, a line length number same as that of the wiring path number P is identified.

The number of sub-lines Y into which a line can be vertically divided and that can be displayed is acquired (step S4107). For example, assuming that a threshold pixel width is three pixels and the line width of a line is seven pixels, Y is yielded as Y=2 from an equality Y=7/3=2, the remainder being one. Therefore, two three-pixel sets can be displayed as a divided display. The remainder may evenly be allocated to the Y sub-lines. When the remainder can not be allocated to the remainder is distributed as evenly as possible. In the example, the seven pixels are divided into a four-pixel set and a three-pixel set.

It is determined whether the display rank of an identical path list of the display path S is within Y (step S4108). When it is determined that the display rank is not within Y (step S4108: NO), the procedure returns to step S4103. On the other hand, when it is determined that the display rank is within Y (step S4108: YES), dividing positions of the line display are set (step S4109). More specifically, the line is divided into Y in its width direction. The dividing positions are allocated to the divided lines in order of descending rank.

Figure 42:
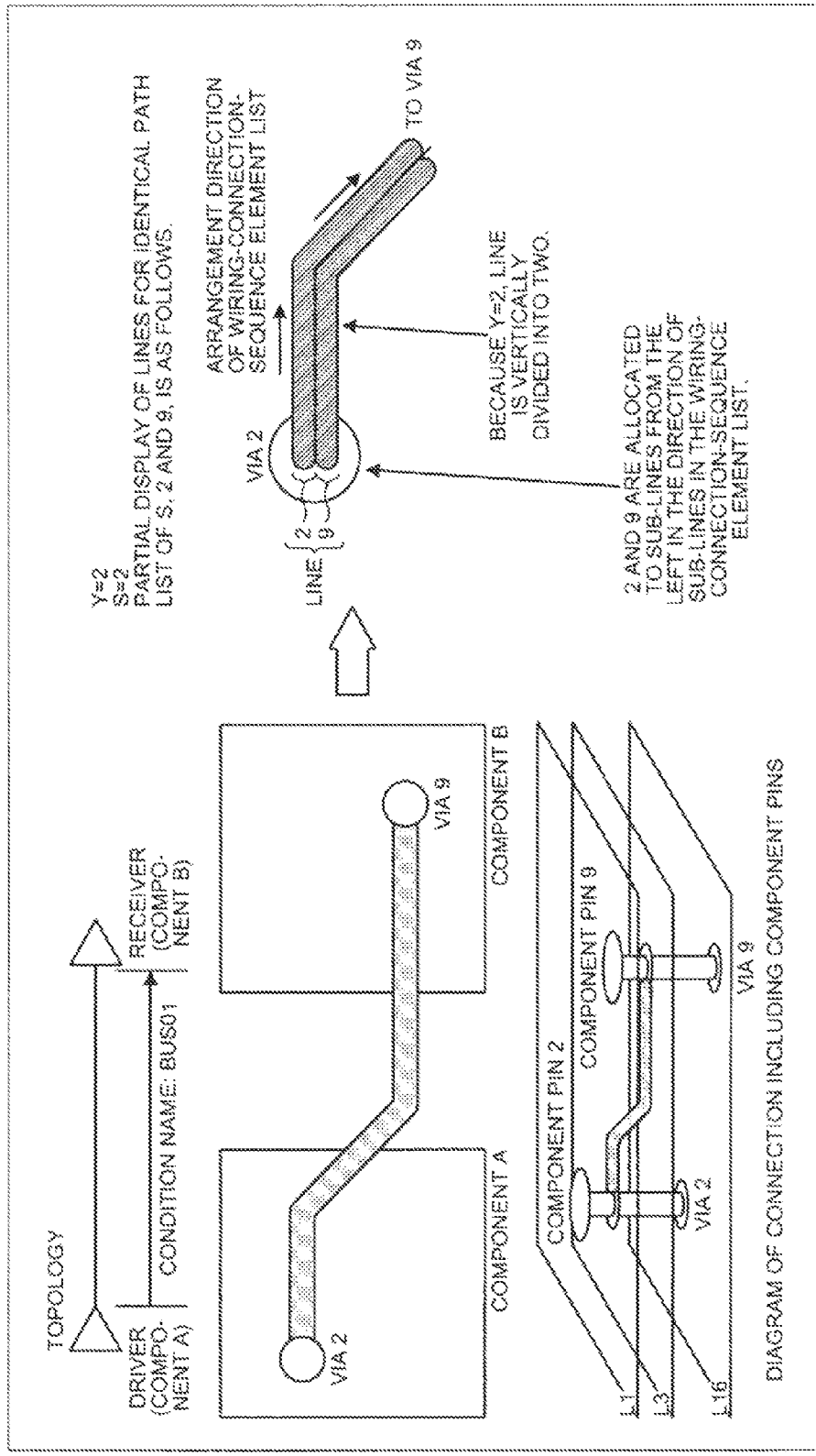
FIG. 42 is an explanatory diagram depicting a specific example of steps S4108 and S4109.

FIG. 42 is an explanatory diagram illustrating a specific example of steps S4108 and S4109. For example, when the display path S (line length number) is S=2 in the display path table 2200 depicted in FIG. 22, the identical path list cites "2 and 9". The arrangement of these numbers represent the display ranks: "2" is ranked at the first place and "9" at the second place. Assuming that Y=2, the display rank of the display path S=2 is the first place and, therefore, this is within Y.

In this case, at step S4109, the dividing positions for the line display are set. More specifically, the line is divided into two parts (Y=2) in the width direction. Of the two divided lines, the display paths are allocated from the upper divided line in order of descending rank. In this case, the display path S=2 is allocated to the upper dividing position and the display path S=9 is allocated to the lower dividing position. Each display path S is drawn through elements in the order described in the wiring connection order element list. For example, for the display path S=2, the lines are drawn in order of the component pin 2, the via 2, the via 9, and the component pin 9.

On the other hand, for S=9, assuming that the identical path list cites "1, 2, and 9", the display rank of the display path S=9 is in the third place and, therefore, is not within Y.

Thereafter, an index number QI of the list is set as QI=1 (step S4110) and it is determined whether QI is larger than the number of numerals in the display section number list of the display path S (step S4111). If QI is larger than the number of numerals (step S4111: YES), the procedure returns to step S4103. On the other hand, if QI is equal to or smaller than the number of numerals of the display section number list of the display path S (step S4111: NO), a QI-th value in the display section number list of the display path S is set to be QN (step S4112) and a drawing process is executed for the display section of the number QN (step S4113). The index number QI is incremented (step S4114) and the procedure returns to step S4111.

At step S4102, if C>Ncod (the total number of line length constraining conditions) (step S4102: YES), the series of process steps come to an end.

Figure 43:
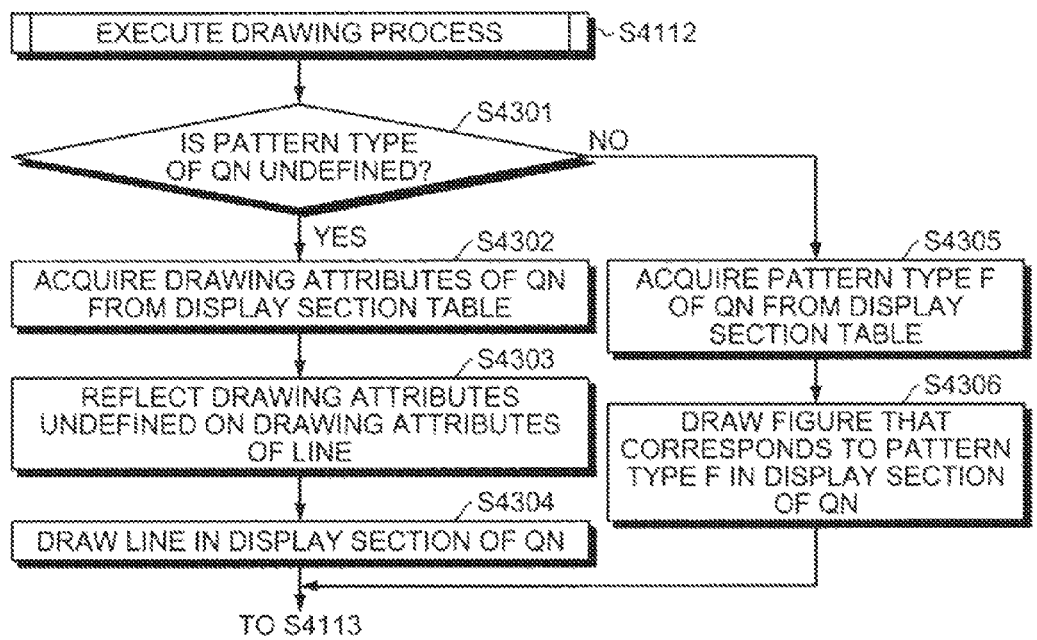
FIG. 43 is a flowchart depicting the detail of a drawing process (step S4112) depicted in FIG. 41.

FIG. 43 is a flowchart illustrating the detail of the drawing process (step S4112) depicted in FIG. 41. It is determined whether a graphic type of the display section number QN is undefined in the display section table 2300 (step S4301). If the graphic type is undefined (step S4301: YES), the drawing attributes of QN (the rendering color D, the line width W, and the line type K) are acquired from the display section table 2300 (step S4302). The drawing attributes that are not undefined are reflected on the drawing attributes of the line (step S4303) and the display section of the display section number QN is drawn for the line (step S4304). The procedure moves to step S4113.

On the other hand, at step S4301, when the graphic type of QN is not undefined (step S4301: NO), the graphic type F of the display section number QN is acquired from the display section table 2300 (step S4305). The display section of the display section number QN is drawn with a figure that corresponds to the graphic type F (step S4306) and the procedure moves to step S4113.

Figure 44:
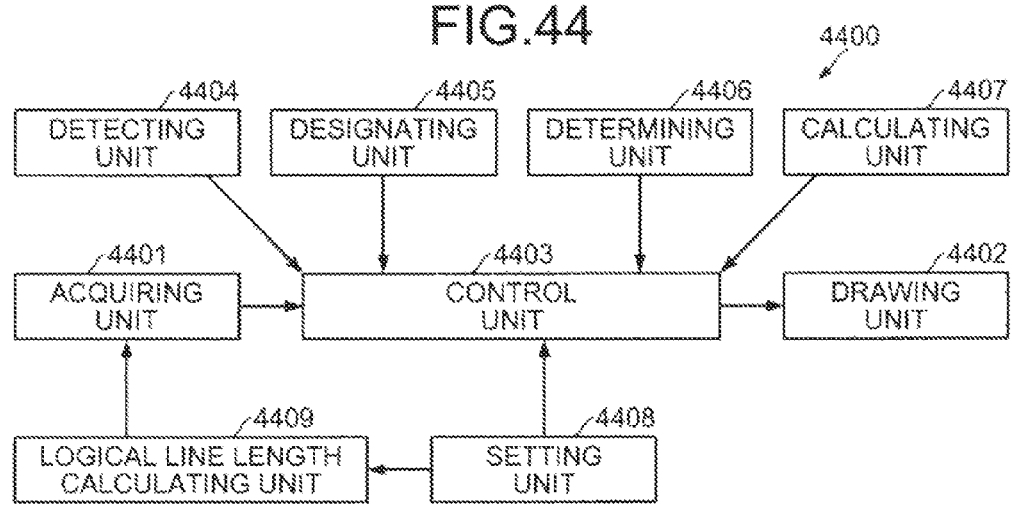
FIG. 44 is a block diagram depicting a functional configuration of a design supporting apparatus.

FIG. 44 is a block diagram illustrating a functional configuration of a design supporting apparatus. A design supporting apparatus 4400 includes an acquiring unit 4401, a drawing unit 4402, a control unit 4403, a detecting unit 4404, a designating unit 4405, a determining unit 4406, a calculating unit 4407, a setting unit 4408, and a logical line length calculating unit 4409. More specifically, for example, these functions 4401 to 4409 realize their functions by causing the CPU 1401 to execute a program stored in a storing apparatus such as the ROM 1402, the RAM 1403, the magnetic disk 1405, and the optical disk 1407 depicted in FIG. 14 or by the I/F 1409. The drawing unit 4402 may be a graphic LSI.

The acquiring unit 4401 has a function of acquiring non-complying line lengths of multiple wiring paths extending from a transmission origin to a transmission destination. For example, the transmission origin is the driver 101 and the transmission destination is the receiver 102. For example, the acquiring unit 4401 reads non-complying values (non-complying line lengths) of the wiring paths between the driver 101 and the receiver 102 depicted in FIGS. 1, 6, and 10. More specifically, the acquiring unit 4401: specifies a record of a corresponding constraining condition number from the line length constraining condition table 2000; refers to the wiring path table 2100 for the wiring path of the wiring path number list; acquires the line length of each wiring path; acquires the base value according to the values of the "line length base information" item in the line length constraining condition table 2000; and acquires the difference between the base value acquired and the line length of the wiring path, as the non-complying line length.

The drawing unit 4402 has a function of drawing a wiring pattern that connects the transmission origin and the transmission destination based on the line length and the wiring route of the wiring path, for each wiring path. More specifically, for example, the drawing unit 4402 draws, for each wiring path, a line amounting to the line length along the wiring route as depicted in the first to thirteenth display examples. The line length of the wiring path is acquired by reading the value in the "line length" item of the wiring path table 2100 depicted in FIG. 21.

The wiring route of the wiring path is acquired by reading the value of the "wiring connection order element list" item of the wiring path table 2100 depicted in FIG. 21. The wiring connection order element list lists in the connected order the numbers of the elements (the land shape, the component pins, the vias, the lines) that forms the wiring path and, therefore, the elements are acquired by reading the values of the "coordinate" items from the tables 1600 to 1900 depicted in FIGS. 16 to 19. The drawing unit 4402 draws the wiring pattern by executing a drawing process based on the values acquired.

The control unit 4403 has a function of controlling the drawing unit 4402 and, for each wiring path, dividing a line that forms the wiring pattern into a first line corresponding to the non-complying line length and a second line corresponding to the line length other than the non-complying line length acquired by the acquiring unit 4401 and drawing the first and the second lines separately.

For example: as described in the first display example, the first and the second lines are drawn, each having different colors; as described in the second display example, the first and the second lines are drawn, each having different widths; and as described in the third display example, the first and the second lines are drawn, each having different line types.

As described in the fourth display example, the control unit 4403 may draw an additional graphic to the first line and distinguish the first and the second lines. As described in the fifth display example, the control unit 4403 may draw a wiring pattern using different colors for each path expressing the extent of non-complying line lengths. Thereby, it can intuitively be grasped how long each of the wiring paths should be shortened/extended to achieve the isometric wiring.

The control unit 4403 draws the first line amounting to the non-complying line length from the transmission origin and, thereby, enables the comparison of the non-complying line lengths of the wiring paths, aligning ends of the first lines.

The control unit 4403 may draw the first line in a different manner depending on whether the non-complying line length exceeds or is short of the base line length. Since the sign of the non-complying line length indicates whether the non-complying line length is excessive or insufficient, the non-complying line lengths can be distinguished even when the insufficient and excessive non-complying line lengths are simultaneously present.

As described in the sixth display example, the control unit 4403 may draw lines so that a line of the wiring path (the base path) adopted as the base line length of the wiring paths is distinguished from the other lines less the non-complying line length. Thereby, it can be known at a glance which wiring path is the base path and, therefore, be intuitively grasped how much the base path and the other paths should be extended/shortened to achieve the isometric wiring.

As described in the seventh display example, when the damping resistance is present in each of the wiring paths, the control unit 4403 may draw lines that form the wiring pattern, distinguishing the first lines of the non-complying line length and the second lines of the line length other than the non-complying line length within an interval from the damping resistance 701 to the transmission destination.

In principle, the mounting position of the damping resistance 701 is in the vicinity of the driver 101 and, therefore, a line length is adjusted on the path between the damping resistance 701 and the receiver 102. Thereby, a guide is displayed in the route whose line length is to be adjusted. Therefore, the designing engineer can save the work lord to determine where the line length is adjusted and can concentrate on editing the wiring pattern. Therefore, reduction of the load of designing can be facilitated.

In FIG. 44, the detecting unit 4404 detects a display area. The detecting unit 4404 detects which part of the areas is displayed on a screen. In this case, as described in the eighth display example, the control unit 4403 draws lines in the display area detected by the detecting unit 4404, distinguishing the first lines and the second lines.

Thereby, as described in the eighth display example, the non-complying line length is always displayed even when the display area is enlarged, shrunk, or changed. Therefore, it can intuitively be grasped how long each of the wiring paths should be extended/shortened to achieve the isometric wiring.

In FIG. 44, the designating unit 4405 has a function of receiving the designation of a display area. More specifically, a user designates the display area by operating an input apparatus such as a mouse. In this case, the control unit 4403 draws lines in the display area designated by the designating unit 4405, distinguishing the first lines and the second lines.

Thereby, as described in the ninth display example, each non-complying line length is always displayed even when the display area in the range designated by the user is enlarged, shrunk, or changed. Therefore, it can intuitively be grasped how long each of the wiring paths should be extended/shortened to achieve the isometric wiring. It can also be known that "the wiring group of this line length constraining condition is made isometric in this range" and, therefore, the area allocation to acquire the isometric wiring with the wiring groups each under another line length constraining condition becomes easy to understand.

In FIG. 44, the determining unit 4406 has a function of determining a line width of the line amounting to the non-complying line length based on the number of the line length constraining conditions for each line length constraining condition when each wiring path has non-complying line lengths under each line length constraining condition.

For example, as described in the tenth display example, when two or more line length constraining conditions are imposed on one wiring path, it is determined how many first lines corresponding to the non-complying line length can be drawn in one wiring path.

In this case, the control unit 4403 divides a line that forms the wiring pattern into first and second lines, and draws the first lines in parallel each having the line width determined by the determining unit 4406. More specifically, as described in the tenth display example, when two or more line length constraining conditions are imposed on one wiring path, the control unit 4403 draws the first lines that have the non-complying line length for each line length constraining condition. Thereby, the non-complying line lengths under the line length constraining conditions can simultaneously be checked.

In FIG. 44, the calculating unit 4407 has a function of calculating a non-complying line length in a target section of a second line length constraining condition that includes an target section of a first line length constraining condition for each wiring path based on the non-complying line length in the target section of the first line length constraining condition.

For example, a path (child path) in the target section of the second line length constraining condition is a parent path of the target section of the first line length constraining condition. As described in the eleventh display example, when the non-complying line length of the parent path is calculated, the child path is required to have been adjusted. However, the calculating unit 4407 calculates a line length assuming that the line length of the child path is adjusted, and acquires the non-complying line length for the second line length constraining condition.

In this case, the control unit 4403 draws the lines in the target section of the first line length constraining condition, dividing a line into the first line and the second line, the first line expressing the non-complying line length in the target section of the first line length constraining condition and the second line expressing the line length less the non-complying line length (error display of the condition 1 in the eleventh display example).

The control unit 4403 draws the lines in the target section of the second line length constraining condition, dividing a line into the first line and the second line, the first line expressing the non-complying line length in the target section of the second line length constraining condition calculated by the calculating unit 4407 and the second line expressing the line length other than the non-complying line length (error display of the condition 2 in the eleventh display example). In this manner, by this drawing, the non-complying line lengths under multiple line length constraining conditions can simultaneously be checked.

In FIG. 44, the setting unit 4408 has a function of setting a tentative wiring route for a wiring path whose wiring route has at least one undefined portion. More specifically, for example, a Manhattan route is calculated for an unwired portion.

The logical line length calculating unit 4409 has a function of calculating the logical line length of the tentative wiring route that is set by the setting unit 4408. More specifically, for example, the route length of the Manhattan route is acquired as the logical line length.

In this case, the acquiring unit 4401 acquires the non-complying line length of the wiring path whose wiring route is not defined, based on the logical line length calculated by the logical line length calculating unit 4409. More specifically, the logical line length calculating unit 4409 acquires a base value according to the line length constraining condition using the logical lien length and acquires the non-complying line length from the base value acquired.

As described in the twelfth display example, the drawing unit 4402 draws the tentative wiring route that is set by the setting unit 4408. More specifically, the drawing unit 4402 draws the Manhattan route. As described in the twelfth display example, the control unit 4403 draws on the tentative wiring route a line of the non-complying line length acquired by the acquiring unit 4401 for a wiring path whose wiring route is not defined, distinguishing the line from the tentative wiring route.

As above, even when the detailed wiring is not executed, a display of an error caused by the non-complying line length can be executed.

From the above, according to the embodiments, in the design data, a wiring path that violates a line length constraining condition can automatically be detected and the non-complying line length can be displayed overlapping the wiring pattern. The display of the non-complying line length is adapted to be displayed when the designing engineer instructs the display of the non-complying line length, and this display is updated in real time matching the editing work by the designing engineer. Thereby, presence or absence of any non-complying wiring path and the length of a non-complying line length can be presented collectively to the designing engineer. Therefore, the designing engineer can efficiently execute the work of editing the wiring patterns to satisfy the constraining conditions.

The design support method explained in the present embodiments can be implemented by a computer, such as a personal computer and a workstation, executing a program that is prepared in advance. The program is recorded on a non-transitory computer-readable recording medium such as a hard disk, a flexible disk, a CD-ROM, an MO, and a DVD, and is executed by being read out from the recording medium by a computer. The program can be a transmission medium that can be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium storing a design supporting program causing a computer to perform:

acquiring non-complying line lengths of a plurality of wiring paths;

drawing for each of the wiring paths a wiring pattern connecting a transmission origin and a transmission destination based on a line length and a wiring route of the wiring path; and controlling the drawing to draw a line for each of the wiring paths, the line being divided into a first line amounting to a non-complying line length acquired at the acquiring and a second line being a wiring pass less the non-complying line length, the non-complying line length is a deviation from a range of a given value.

2. The medium according to claim 1, wherein
at the controlling, the first and the second lines are distinguished by using different rendering colors, different line widths, or different line types.

3. The medium according to claim 1, wherein
at the controlling, an additional figure is drawn to the first line.

4. The medium according to claim 1, wherein
at the controlling, the first line amounting to the non-complying line length is drawn from the transmission origin.

5. The medium according to claim 1, wherein
at the controlling, the first line is drawn depending on whether the non-complying line length exceeds or is short of a base line length.

6. The medium according to claim 1, wherein
at the controlling, a line adopted as a base line length is drawn, distinguishing the line from part of the other lines that is not adopted as the base line length, the part not including the non-complying line length.

7. The medium according to claim 1, wherein
when a wiring path includes a damping resistance, at the controlling, a line is drawn in an interval between the damping resistance and the transmission destination, the line being divided into the first line and the second line.

8. The medium according to claim 1, wherein
the design supporting program further causes the computer to perform
detecting a display area, and wherein
at the controlling, a line is drawn within the display area, the line being divided into the first line and the second line.

9. The medium according to claim 1, wherein
the design supporting program further causes the computer to perform
receiving an input of a display area, and wherein
at the controlling, a line is drawn within the display area, the line being divided into the first line and the second line.

10. The medium according to claim 1, wherein
the design supporting program further causes the computer to perform
determining, when each of the wiring paths has a non-complying line length under each line length constraining condition, determines a line width of a line of the non-complying line length under each line length constraining condition, based on number of line length constraining conditions, and wherein
at the controlling, lines divided into the first lines and the second lines are drawn, the first lines in parallel having the width determined by at the determining.

11. The medium according to claim 1, wherein
the design supporting program causes the computer to perform
calculating a non-complying line length in an target section of a second line length constraining condition that includes an target section of a first line length constraining condition, based on a non-complying line length in the target section of the first line length constraining condition, and wherein
at the controlling, a line is drawn in the target section of the first line length constraining condition, the line being divided into a first line amounting to a non-complying line length in the target section of the first line length constraining condition and a second line being a wiring path less the non-complying line length, and also draws a line in the target section of the second line length constraining condition, the line being divided into a first line amounting to a non-complying line length in the target section of the second line length constraining condition calculated at the calculating and a second line being a wiring path less the non-complying line length.

12. A non-transitory computer-readable recording medium storing a design supporting program causing a computer to perform:
acquiring non-complying line lengths of a plurality of wiring paths;
drawing for each of the wiring paths a wiring pattern connecting a transmission origin and a transmission destination based on a line length and a wiring route of a wiring path; and
controlling the drawing to draw the wiring pattern with colors corresponding to the non-complying line lengths, the non-complying line lengths are a deviation from a range of a given value.

13. A design supporting apparatus comprising:
an acquiring unit configured to acquire non-complying line lengths of a plurality of wiring paths;
a drawing unit configured to draw for each of the wiring paths a wiring pattern connecting a transmission origin and a transmission destination based on a line length and a wiring route of the wiring path; and
a controlling unit configured to control the drawing unit to draw a line for each of the wiring paths, the line being divided into a first line amounting to a non-complying line length acquired by the acquiring unit and a second line being a wiring pass less the non-complying line length, the non-complying line length is a deviation from a range of a given value.

14. A design supporting method comprising:
acquiring non-complying line lengths of a plurality of wiring paths;
drawing a wiring pattern that connects a transmission origin and a transmission destination based on a line length and a wiring route of the wiring path; and
controlling the drawing to draw a line, the line being divided into a first line amounting to a non-complying line length acquired at the acquiring and a second line being a wiring pass less the non-complying line length, the non-complying line length is a deviation from a range of a given value.

* * * * *